(12) United States Patent
Jeong et al.

(10) Patent No.: US 9,653,667 B2
(45) Date of Patent: May 16, 2017

(54) LIGHT EMITTING DEVICE HAVING A CONNECTION PART ELECTRICALLY COUPLED A FIRST ELECTRODE AND A CONDUCTIVE SUPPORT MEMBER

(71) Applicant: LG INNOTEK CO., LTD., Seoul (KR)

(72) Inventors: Hwan Hee Jeong, Seoul (KR); So Jung Kim, Seoul (KR); Hyun Ju Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 13/970,803

(22) Filed: Aug. 20, 2013

(65) Prior Publication Data
US 2014/0048839 A1    Feb. 20, 2014

(30) Foreign Application Priority Data

Aug. 20, 2012   (KR) .................. 10-2012-0090679
Sep. 3, 2012    (KR) .................. 10-2012-0096911

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/385* (2013.01); *H01L 33/0079* (2013.01); *H01L 33/22* (2013.01);
(Continued)

(58) Field of Classification Search
CPC ... H01L 33/382; H01L 33/387; H01L 33/405; H01L 33/62
(Continued)

(56) References Cited

U.S. PATENT DOCUMENTS 8,575,644 B2 * 11/2013 Jeong et al. .............. 257/99
2010/0078656 A1 * 4/2010 Seo .................. H01L 27/156
                                                    257/88
(Continued)

FOREIGN PATENT DOCUMENTS

EP    2 348 551 A2    7/2011
EP    2 362 449 A2    8/2011
(Continued)

OTHER PUBLICATIONS

Europe Search Report issued in Application No. 13180862.8 dated Mar. 31, 2016.

*Primary Examiner* — Anh Mai
(74) *Attorney, Agent, or Firm* — KED & Associates, LLP

(57) ABSTRACT

A light emitting device includes a light emitting structure including a first conductive semiconductor layer, an active layer under the first conductive semiconductor layer, and a second conductive semiconductor layer adjacent the active layer. A first electrode is electrically coupled to the first conductive semiconductor layer, and a second electrode is electrically coupled to the second conductive semiconductor layer. A channel layer is provided at a peripheral portion of a lower portion of the light emitting structure, and a conductive support member is provided adjacent to the second electrode. A first connection part is electrically coupled to the first electrode and the conductive support member, and a second connection part is electrically coupled to the second electrode.

17 Claims, 25 Drawing Sheets

(51) Int. Cl.
  *H01L 33/22* (2010.01)
  *H01L 33/38* (2010.01)
  *H01L 33/40* (2010.01)
  *H01L 33/44* (2010.01)

(52) U.S. Cl.
  CPC ............ *H01L 33/38* (2013.01); *H01L 33/405* (2013.01); *H01L 33/44* (2013.01); *H01L 2224/48091* (2013.01)

(58) Field of Classification Search
  USPC .............................................. 257/79, 98, 99
  See application file for complete search history.

(56) References Cited

U.S. PATENT DOCUMENTS

| | | |
|---|---|---|
| 2010/0308358 A1 | 12/2010 | Bae et al. |
| 2011/0049537 A1* | 3/2011 | Lee .................... H01L 25/0753 257/88 |
| 2011/0193123 A1* | 8/2011 | Moon ................... H01L 33/382 257/98 |
| 2011/0198660 A1 | 8/2011 | Bae et al. |
| 2011/0248237 A1* | 10/2011 | Choi et al. ....................... 257/13 |
| 2011/0260192 A1 | 10/2011 | Kwak et al. |
| 2011/0284910 A1* | 11/2011 | Iduka .................... H01L 33/385 257/99 |
| 2011/0297972 A1* | 12/2011 | Seo et al. ........................ 257/88 |
| 2012/0007121 A1 | 1/2012 | Lee et al. |
| 2012/0033409 A1* | 2/2012 | Jeong ..................... H01L 33/20 362/97.1 |
| 2012/0182738 A1* | 7/2012 | Jeong .................. H01L 27/156 362/249.02 |
| 2014/0061685 A1* | 3/2014 | Jeong ............................ 257/88 |
| 2014/0191267 A1* | 7/2014 | Jeong ............................ 257/98 |
| 2015/0303352 A1 | 10/2015 | Jeong |

FOREIGN PATENT DOCUMENTS

| | | | | |
|---|---|---|---|---|
| EP | 2 860 771 A1 | | 4/2015 | |
| KR | 10-2012-0051969 | * | 5/2012 | ............. H01L 33/36 |

* cited by examiner

LIGHT EMITTING DEVICE HAVING A CONNECTION PART ELECTRICALLY COUPLED A FIRST ELECTRODE AND A CONDUCTIVE SUPPORT MEMBER

CROSS-REFERENCE TO RELATED APPLICATIONS

The present application claims priority under 35 U.S.C. 119 to Korean Patent Application No. 10-2012-0090679 filed on Aug. 20, 2012, and Korean Patent Application No. 10-2012-0096911 filed on Sep. 3, 2012, which are hereby incorporated by reference in theirs entirety.

BACKGROUND

The embodiment relates to a light emitting device, a light emitting device package, and a light unit.

A light emitting diode (LED) has been extensively used as one of light emitting devices. The LED converts electrical signals into the form of light such as infra-red light, ultraviolet light, and visible light by using the characteristic of a compound semiconductor.

As the light efficiency of the light emitting device is increased, the LED has been used in various fields such as display apparatuses and lighting appliances.

The above references are incorporated by reference herein where appropriate for appropriate teachings of additional or alternative details, features and/or technical background.

SUMMARY

The embodiment provides a light emitting device capable of preventing current concentration, and improving light efficiency and electrical reliability, a light emitting device package, and a light unit.

According to the embodiment, there is provided a light emitting device comprising a light emitting structure comprising a first conductive semiconductor layer, an active layer under the first conductive semiconductor layer, and a second conductive semiconductor layer under the active layer, a first electrode electrically connected to the first conductive semiconductor layer, a second electrode electrically connected to the second conductive semiconductor layer, a channel layer at a peripheral portion of a lower portion of the light emitting structure, a conductive support member under the second electrode, a first connection part electrically connected to the first electrode and the conductive support member, and a second connection part electrically connected to the second electrode.

According to the embodiment, there is provided a light emitting device comprising a light emitting structure comprising a first conductive semiconductor layer, an active layer under the first conductive semiconductor layer, and a second conductive semiconductor layer under the active layer, a first electrode electrically connected to the first conductive semiconductor layer, a second electrode electrically connected to the second conductive semiconductor layer, a channel layer at a peripheral portion of a lower portion of the light emitting structure, a conductive support member under the second electrode, a first connection part electrically connected to the first electrode and the conductive support member, and a second connection part electrically connected to the second electrode. The first connection part makes contact with a lateral side of the first conductive semiconductor layer, and the channel layer surrounds the active layer.

According to the embodiment, there is provided a light emitting device comprising a light emitting structure comprising a first conductive semiconductor layer, an active layer under the first conductive semiconductor layer, and a second conductive semiconductor layer under the active layer, a first electrode electrically connected to the first conductive semiconductor layer, a second electrode electrically connected to the second conductive semiconductor layer, a channel layer at a peripheral portion of a lower portion of the light emitting structure, a conductive support member under the second electrode, a first connection part electrically connected to the first electrode and the conductive support member, and a second connection part electrically connected to the second electrode. One end of the second connection part is spaced apart from a sidewall of the light emitting structure, and exposed to a lateral side of the light emitting structure, and a top surface of the channel layer is disposed higher than a top surface of the active layer.

As described above, the embodiment provides a light emitting device capable of preventing current concentration, and improving light efficiency and electrical reliability, a light emitting device package, and a light unit.

BRIEF DESCRIPTION OF THE DRAWINGS

The embodiments will be described in detail with reference to the following drawings in which like reference numerals refer to like elements wherein:

FIGS. 18 to 21 are sectional views showing modifications of the light emitting device according to the embodiment.

DETAILED DESCRIPTION OF THE EMBODIMENTS

Figure 1:
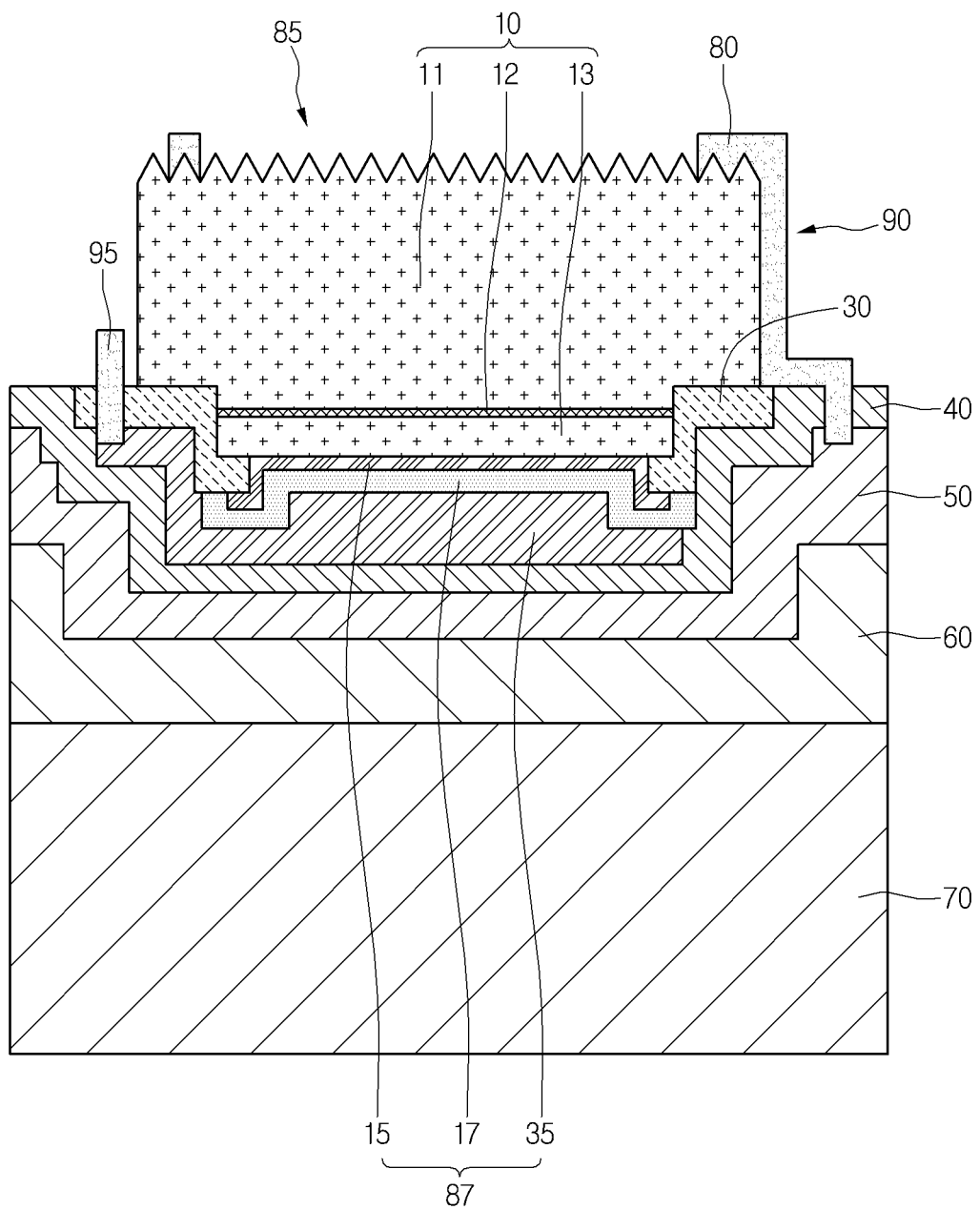
FIG. 1 is a view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit, and a method for fabricating the same according to the embodiments will be described in detail with reference to accompanying drawings.

FIG. 1 is a view showing a light emitting device according to the embodiment.

As shown in FIG. 1, the light emitting device according to the embodiment may comprise a light emitting structure 10, a conductive support member 70, a first electrode 80, and a second electrode 87.

The light emitting structure 10 may comprise a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be disposed under the first conductive semiconductor layer 11, and the second conductive semiconductor layer 13 may be disposed under the active layer 12.

The first conductive semiconductor layer 11 may comprise an N-type semiconductor layer doped with N-type dopants serving as first conductive dopants, and the second conductive semiconductor layer 13 may comprise a P-type semiconductor layer doped with P-type dopants serving as second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

For example, the active layer 12 may be realized by using a compound semiconductor. The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may comprise a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may comprise one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be additionally disposed under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The light emitting device according to the embodiment may comprise a channel layer 30 disposed at a peripheral portion of a lower portion of the light emitting structure 10. For example, a top surface of the channel layer 30 may be disposed higher than a top surface of the active layer 12. The channel layer 30 may surround the active layer 12. The channel layer 30 may surround a peripheral portion of the second conductive semiconductor layer 13. One end of the channel layer 30 may be disposed under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the second electrode 87. The one end of the channel layer 30 may be disposed between the second conductive semiconductor layer 13 and a reflective layer 17.

For example, the channel layer 30 may be realized by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The first electrode 80 may be electrically connected to the first conductive semiconductor layer 11. The first electrode 80 may be disposed on the first conductive semiconductor layer 11. The first electrode 80 may make contact with the first conductive semiconductor layer 11. The reflective layer 17 may be electrically connected to the second conductive semiconductor layer 13. The reflective layer 17 may be disposed under the light emitting structure 10. The reflective layer 17 may be disposed under the second conductive semiconductor layer 13.

The light emitting device according to the embodiment may comprise an ohmic contact layer 15 disposed between the reflective layer 17 and the second conductive semiconductor layer 13. The ohmic contact layer 15 may contact with the second conductive semiconductor layer 13.

The ohmic contact layer 15 may make ohmic contact with the light emitting structure 10. The ohmic contact layer 15 may comprise an ohmic contact region with the light emitting structure 10. The reflective layer 17 may be electrically connected to the second conductive semiconductor layer 13. In addition, the reflective layer 17 reflects light incident thereto from the light emitting structure 10 to increase the quantity of light extracted to an outside.

For example, the ohmic contact layer 15 may comprise a transparent conductive oxide layer. For example, the ohmic contact layer 15 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may comprise a material having high reflectance. For example, the reflective layer 17 may comprise metal comprising at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may comprise at least one of Ag, Al, an Ag—Pd—Cu alloy, and an Ag—Cu alloy.

For example, the reflective layer 17 may have a structure in which an Ag layer and a Ni layer are alternately formed, and may comprise Ni/Ag/Ni or a Tl layer, and a Pt layer. In addition, the ohmic contact layer 15 may be disposed under the reflective layer 17, and at least a portion of the ohmic contact layer 15 may make ohmic contact with the light emitting structure 10 through the reflective layer 17.

The light emitting device according to the embodiment may comprise a first metal layer 35 disposed under the reflective layer 17. The first metal layer 35 may comprise at least one of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35. For example, the second electrode 87 may comprise all of the reflective layer 17, the first metal layer 35, and the ohmic contact layer 15, or may comprise one or two selected from the of the reflective layer 17, the first metal layer 35, and the ohmic contact layer 15.

The light emitting device according to the embodiment may comprise a second metal layer 50 disposed under the first metal layer 35.

The second metal layer 50 may comprise at least one of Cu, Ni, Ti, Ti—W, Cr, W, Pt, V, Fe, and Mo. The second metal layer 50 may serve as a diffusion barrier layer. A bonding layer 60 and the conductive support member 70 may be disposed under the second metal layer 50.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, power may be applied to the light emitting structure 10 through the second electrode 87 and the first electrode 80. According to the embodiment, the first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

A roughness 85 may be formed on the top surface of the first conductive semiconductor layer 11. Accordingly, the quantity of light extracted upward at the region where the roughness 85 is formed can be increased.

The light emitting device according to the embodiment may comprise an insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The top surface of the insulating layer 40 may be exposed to a peripheral portion of the lower portion of the light emitting structure 10. The insulating layer 40 may surround a peripheral portion of the channel layer 30.

The light emitting device according to the embodiment may comprise a first connection part 90 and a second connection part 95. The first connection part 90 may be electrically connected to the first electrode 80 and the conductive support member 70. The second connection part 95 may be electrically connected to the reflective layer 17. The second connection part 95 may electrically connected to the second electrode 87.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection part 90 may be disposed through the insulating layer 40. The first connection part 90 may be electrically connected to the conductive support member 70 through the insulating layer 40. In addition, the first connection part 90 may be electrically connected to the second metal layer 50 through the channel layer 30. The first connection part 90 may be electrically connected to the second metal layer 50 through the channel layer 30 and the insulating layer 40.

The first connection part 90 may be disposed at a lateral side of the light emitting structure 10. The first connection part 90 may be disposed at a lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be disposed on the channel layer 30. The one end of the second connection part 95 may be spaced apart from the lateral side of the light emitting structure 10. The one end of the second connection part 95 may be exposed to the lateral side of the light emitting structure 10.

The second connection part 95 may be electrically connected to the first metal layer 35 through the channel layer 30. In addition, the second connection part 95 may be electrically connected to the first metal layer 35 through the insulating layer 40. The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Hereinafter, a method of fabricating the light emitting device according to the embodiment will be described with reference to FIGS. 2 to 6.

Figure 2:
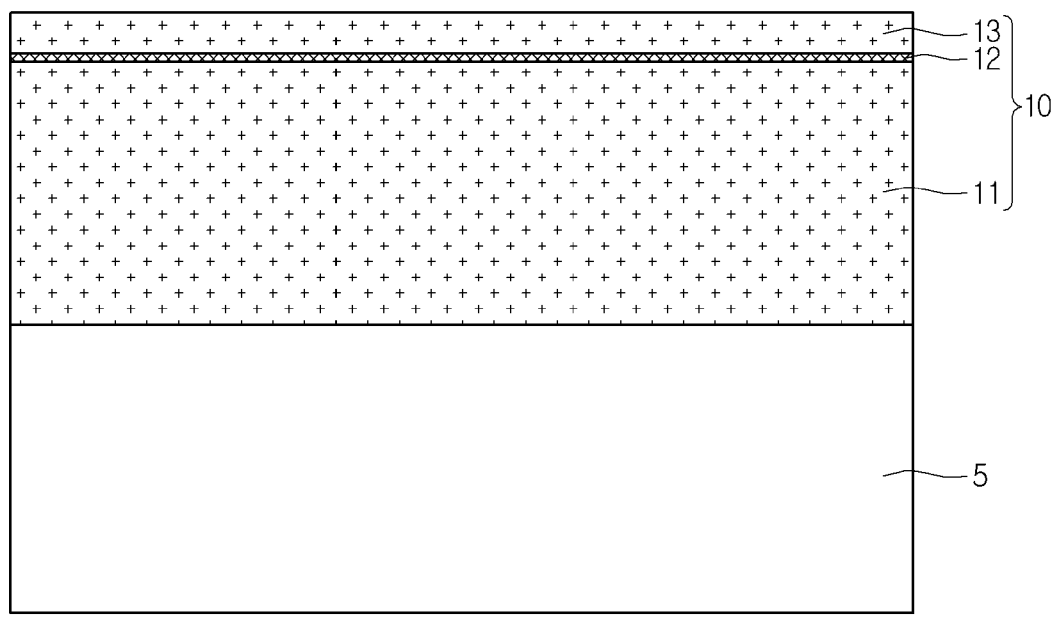
FIGS. 2 to 6 are sectional views showing a method of fabricating a light emitting device.

According to the method of fabricating the light emitting device of the embodiment, as shown in FIG. 2, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light emitting structure 10.

For example, the substrate 5 may comprise at least one of a sapphire substrate (Al2O3), SiC, GaAs, GaN, ZnO, Si, GaP, InP, and Ge, but the embodiment is not limited thereto. A buffer layer may be disposed between the first conductive semiconductor layer 11 and the substrate 5.

The first conductive semiconductor layer 11 may comprise an N-type semiconductor layer doped with N-type dopants serving as first conductive dopants, and the second conductive semiconductor layer 13 may comprise a P-type semiconductor layer doped with P-type dopants serving as second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor. The first conductive semiconductor layer 11 may comprise a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may comprise one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be additionally disposed on the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform doping concentration. In other words, the light emitting structure 10 may have various structures, but the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

Figure 3:
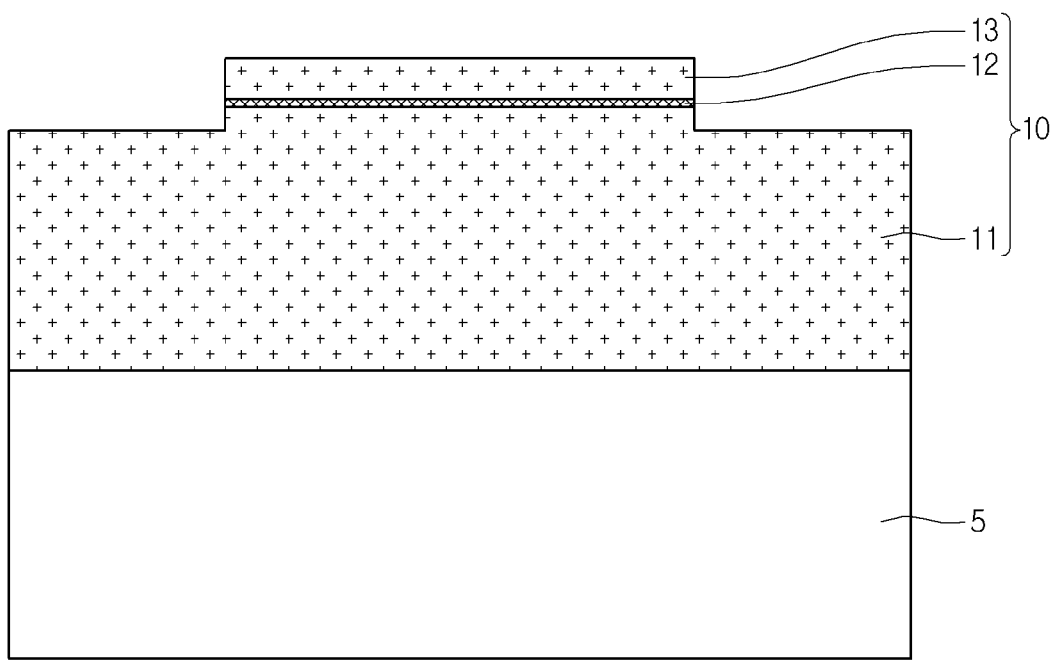

Next, as shown in FIG. 3, a portion of the first conductive semiconductor layer 11 may be exposed by performing an etching scheme for the light emitting structure 10. In this case, the etching may comprise a wet etching scheme or a dry etching scheme.

Figure 4:
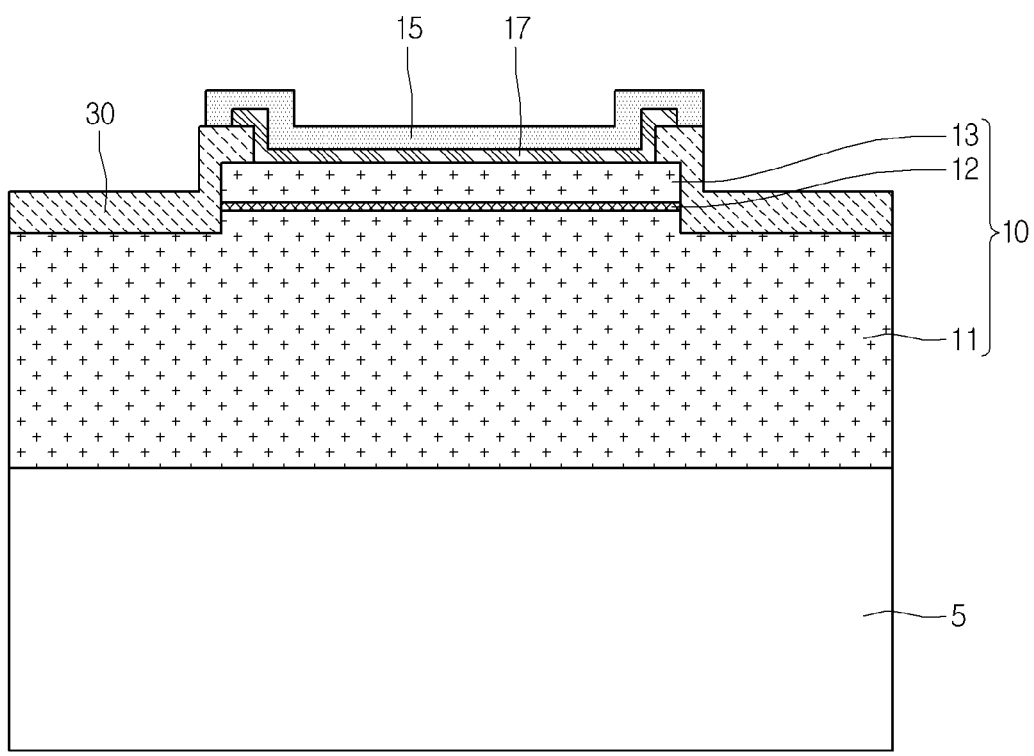

Next, as shown in FIG. 4, the light emitting structure 10 may be disposed therein with the channel layer 30, the ohmic contact layer 15, and the reflective layer 17.

For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The ohmic contact layer 15 may be disposed between the reflective layer 17 and the second conductive semiconductor layer 13. The ohmic contact layer 15 may make contact with the second conductive semiconductor layer 13.

The ohmic contact layer 15 may make contact with the light emitting structure 10. The reflective layer 17 may be electrically connected to the second conductive semiconductor layer 13. The ohmic contact layer 15 may comprise an ohmic-contact region with the light emitting structure 10.

For example, the ohmic contact layer 15 may comprise a transparent conductive oxide layer. For example, the ohmic contact layer 15 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may comprise a material having high reflectance. For example, the reflective layer 17 may comprise metal comprising at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may comprise at least one of Ag, Al, an Ag—Pd—Cu alloy, and an Ag—Cu alloy.

For example, the reflective layer 17 may have a structure in which an Ag layer and a Ni layer are alternately formed, and may comprise Ni/Ag/Ni or a TI layer, and a Pt layer. In addition, the ohmic contact layer 15 may be disposed under the reflective layer 17, and at least a portion of the ohmic contact layer 15 may make ohmic contact with the light emitting structure 10 through the reflective layer 17.

Figure 5:
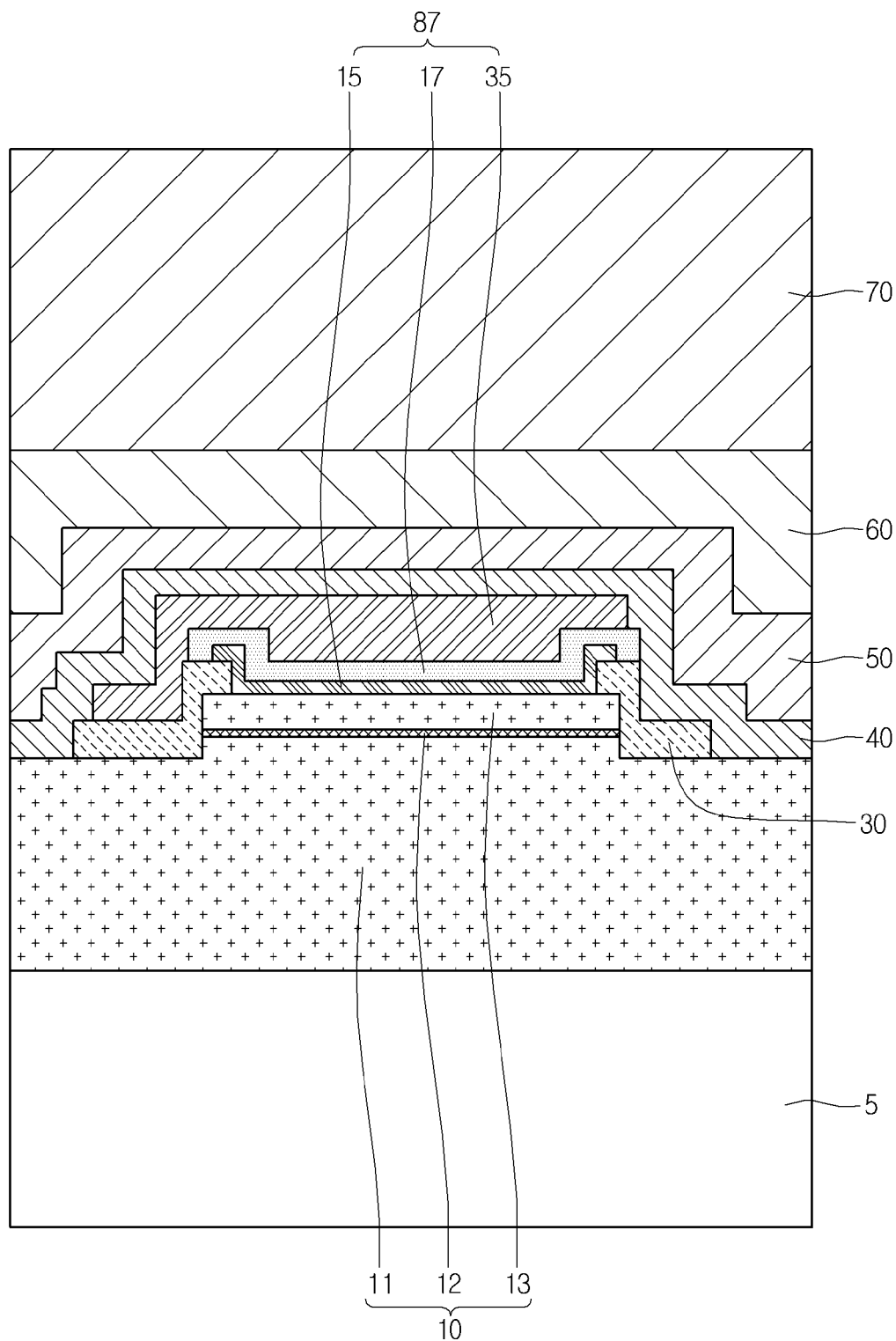

Thereafter, as shown in FIG. 5, the first metal layer 35, the insulating layer 40, the second metal layer 50, the bonding layer 60, and the conductive support member 70 may be formed on the reflective layer 17.

The first metal layer 35 may comprise at least one selected from the group consisting of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35.

The insulating layer 40 may insulate the first metal layer 35 from the second metal layer 50. The insulating layer 40 may insulate the first metal layer 35 from the conductive support member 70.

The insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and MN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The second metal layer 50 may comprise at least one of Cu, Ni, Ti, Ti—W, Cr, W, Pt, V, Fe, and Mo. The second metal layer 50 may serve as a diffusion barrier layer.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

Next, the substrate 5 is removed from the first conductive semiconductor layer 11. According to one example, the substrate 5 may be removed through a laser lift off (LLO) process. The LLO process is a process to laminate the substrate 5 from the first conductive semiconductor layer 11 by irradiating a laser to the bottom surface of the substrate 5.

Figure 6:
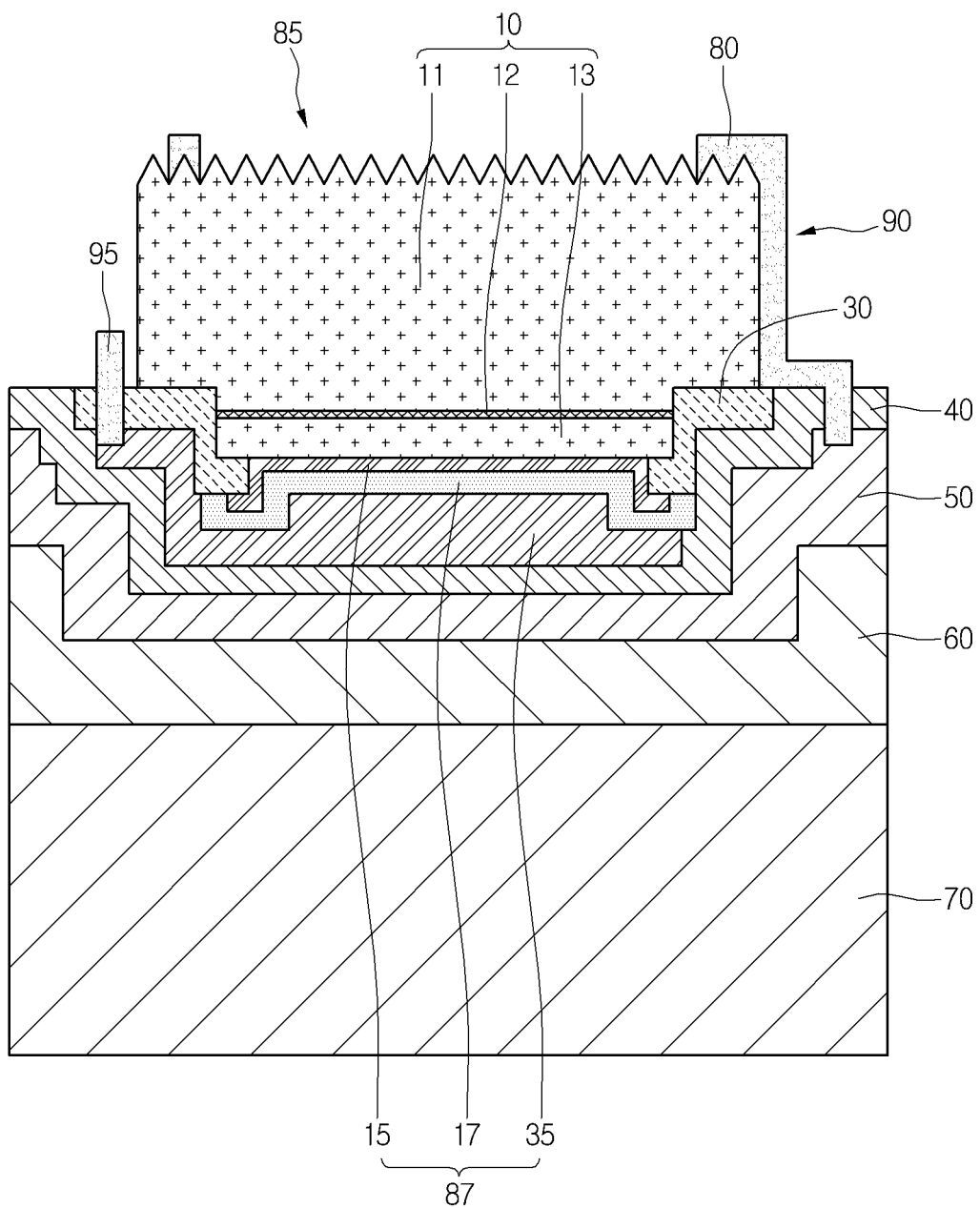

In addition, as shown in FIG. 6, the lateral side of the light emitting structure 10 is etched through an isolation etching process to expose a portion of the channel layer 30. In this case, a portion of the insulating layer 40 may be exposed. The isolation etching process may be performed through a dry etching process such as an inductively coupled plasma (ICP), but the embodiment is not limited thereto.

The roughness 85 may be formed on the top surface of the first conductive semiconductor layer 11. Accordingly, a light extraction pattern may be disposed on the light emitting structure 10. A concave-convex pattern may be disposed on the light emitting structure 10. For example, the light extraction pattern provided on the light emitting structure 10 may be formed through a PEC (photo electro chemical) etching process. Therefore, according to the embodiment, the external light extraction effect can be increased.

Next, as shown in FIG. 6, the light emitting structure 10 may be disposed thereon with the first electrode 80, the first connection part 90, and the second connection part 95.

The first electrode 80 may be electrically connected to the first conductive semiconductor layer 11. A portion of the first electrode 80 may make contact with the first conductive semiconductor layer 11. According to the embodiment, power may be applied to the light emitting structure 10 through the first electrode 80 and the second electrode 87.

The first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, and Au.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60. The first connection part 90 may be disposed through the insulating layer 40. The first connection part 90 may be electrically connected to the conductive support member 70 through the insulating layer 40. The first connection part 90 may be electrically connected to the second metal layer 50 through the channel layer 30.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 µm.

The second connection part 95 may be electrically connected to the first metal layer 35. The second connection part 95 may make contact with the first metal layer 35. One end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30. In addition, the second connection part 95 may be electrically connected to the first metal layer 35 through the insulating layer 40.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Meanwhile, the process of forming each layer described above is provided for the illustrative purpose, and the process sequence thereof may be variously modified.

Figure 7:
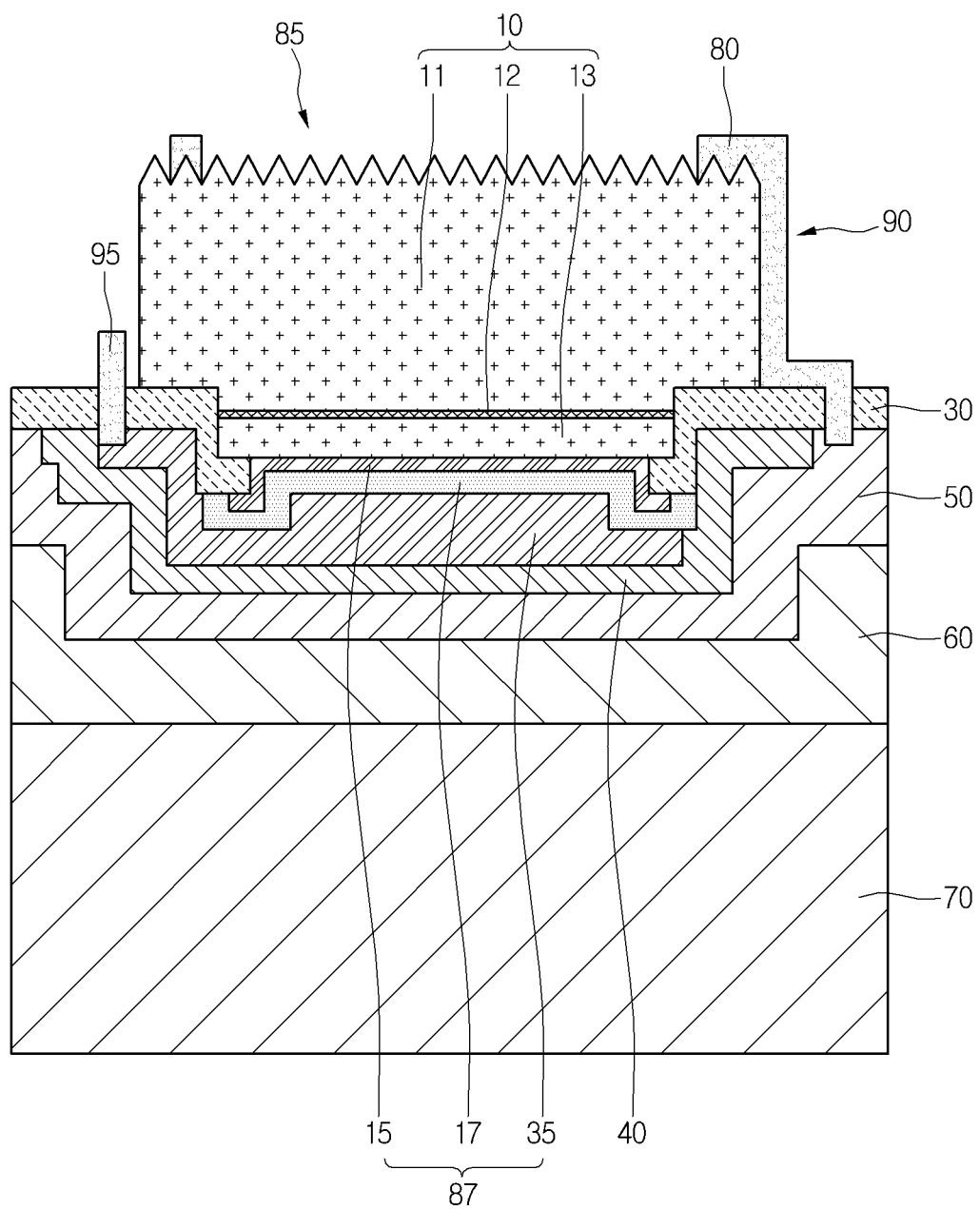
FIGS. 7 to 11 are sectional views showing modifications of the light emitting device according to the embodiment.

FIG. 7 is a sectional view showing another example of a light emitting device according to the embodiment. In the following description about the light emitting device shown in FIG. 7, components and structures the same as those described with reference to FIG. 1 will not be further described in order to avoid redundancy.

According to the embodiment shown in FIG. 7, the channel layer 30 is disposed at the peripheral portion of the lower portion of the light emitting structure 10, and the insulating layer 40 may not be exposed to the peripheral portion of the lower portion of the light emitting structure 10.

The light emitting device according to the embodiment may comprise the channel layer 30 disposed at the peripheral portion of the lower portion of the light emitting structure 10. For example, the top surface the channel layer 30 may be disposed higher than the top surface of the active layer 12. The channel layer 30 may surround the active layer 12. The channel layer 30 may surround a peripheral portion of the second conductive semiconductor layer 13. One end of the channel layer 30 may be disposed under the second conductive semiconductor layer 13. The one end of the channel layer 30 may make contact with a bottom surface of the second conductive semiconductor layer 13. The one end of the channel layer 30 may be disposed between the second conductive semiconductor layer 13 and a reflective layer 17.

For example, the channel layer 30 may be realized by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The light emitting device according to the embodiment may comprise the insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The light emitting device according to the embodiment may comprise the first connection part 90 and the second connection part 95. The first connection part 90 may be electrically connected to the first electrode 80 and the conductive support member 70. The second connection part 95 may be electrically connected to the reflective layer 17. According to the embodiment, the second electrode 87 may comprise at least one of the reflective layer 17, the ohmic contact layer 15, and the first metal layer 35.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60. The first connection part 90 may be disposed through the channel layer 30. The first connection part 90 may be connected to the conductive support member 70 through the channel layer 30.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Figure 8:
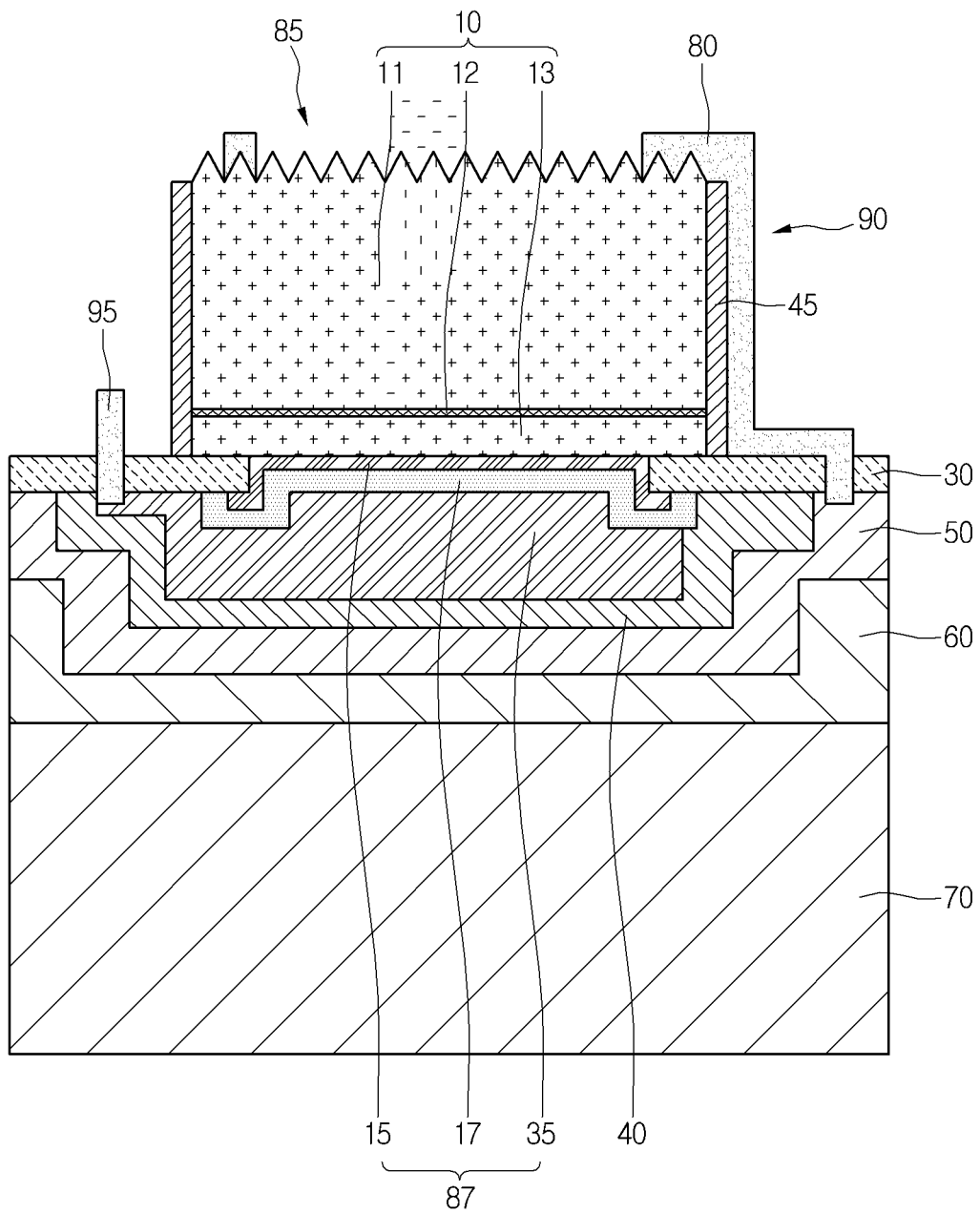

FIG. 8 is a sectional view showing still another example of a light emitting device according to the embodiment. In the following description about the light emitting device shown in FIG. 8, components and structures the same as those described with reference to FIG. 1 will not be further described in order to avoid redundancy.

According to the embodiment shown in FIG. 8, a protective layer 45 may be disposed at the lateral side of the light emitting structure 10. In addition, the channel layer 30 may be disposed at the peripheral portion of the lower portion of the light emitting structure 10. The protective layer 45 may be disposed between the light emitting structure 10 and the first connection part 90. The protective layer 45 may insulate the first connection part 90 from the active layer 12. The protective layer 45 may insulate the first connection part 90 from the second conductive semiconductor layer 13.

For example, the protective layer 45 may be realized by using an oxide or a nitride. For example, the protective layer 45 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The light emitting device according to the embodiment may comprise the channel layer 30 disposed around the lower portion of the light emitting structure 10. For example, the top surface of the channel layer 30 may be disposed higher than the top surface of the active layer 12. One end of the channel layer 30 may be disposed under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the reflective layer 17. The one end of the channel layer 30 may be disposed between the second conductive semiconductor layer 13 and the second electrode 87.

For example, the channel layer 30 may be realized by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The light emitting device according to the embodiment may comprise the insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The top surface of the insulating layer 40 may be exposed to a peripheral portion of the lower portion of the light emitting structure 10. The insulating layer 40 may surround a peripheral portion of the channel layer 30.

The light emitting device according to the embodiment may comprise a first connection part 90 and a second connection part 95. The first connection part 90 may be electrically connected to the first electrode 80 and the conductive support member 70. The second connection part 95 may be electrically connected to the reflective layer 17.

The second connection part 95 may electrically connected to the second electrode 87. According to the embodiment, the second electrode 87 may comprise at least one of the reflective layer 17, the ohmic contact layer 15, and the first metal layer 35.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60. The first connection part 90 may be disposed through the insulating layer 400. The first connection part 90 may be electrically connected to the conductive support member 70 through the insulating layer 40.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 µm.

The second connection part 95 may be electrically connected to the first metal layer 35. The second connection part 95 may make contact with the first metal layer 35. One end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Figure 9:
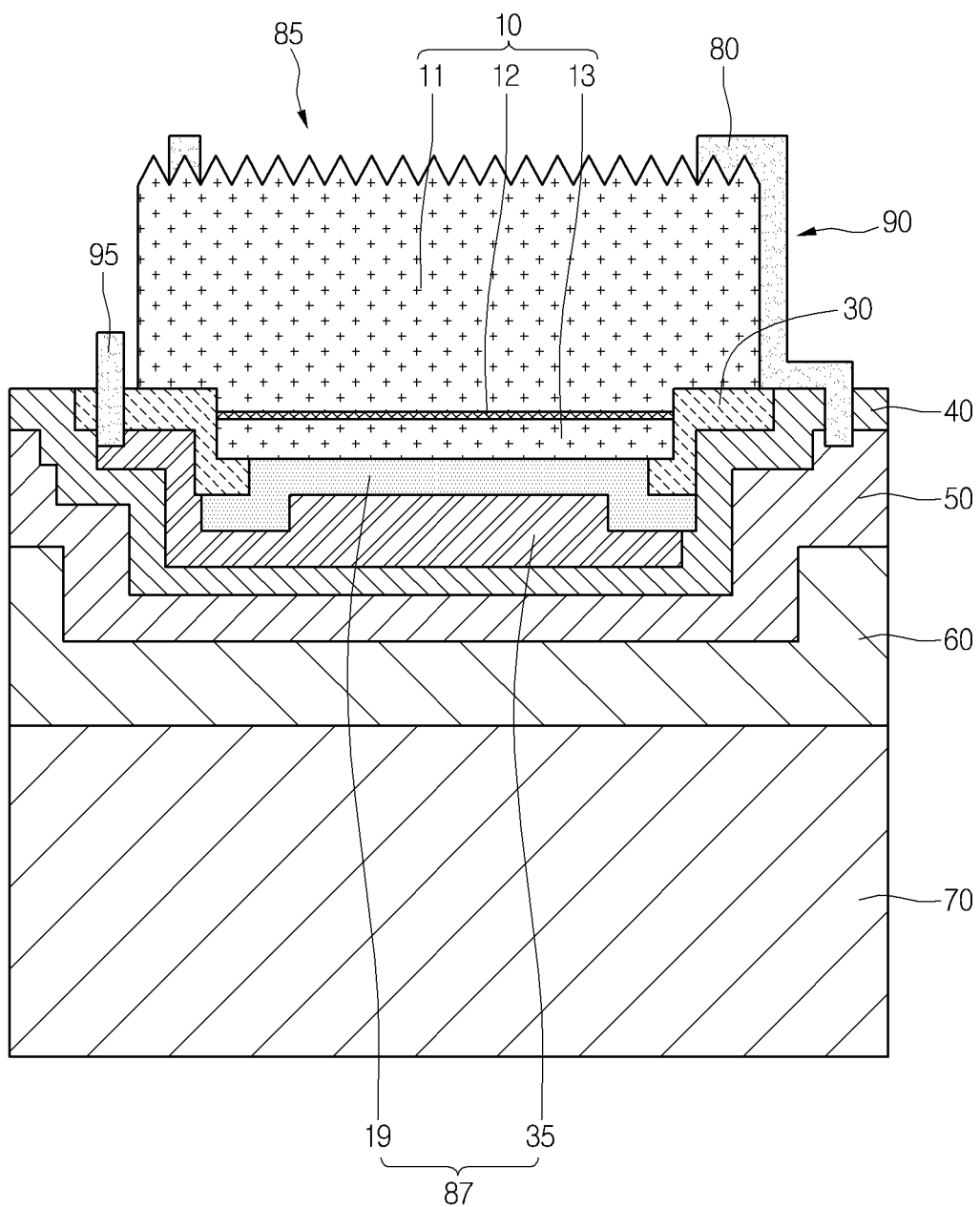

FIG. 9 is a sectional view showing still another example of a light emitting device according to the embodiment. In the following description about the light emitting device shown in FIG. 9, components and structures the same as those described with reference to FIG. 1 will not be further described in order to avoid redundancy.

According to the light emitting device of the embodiment, an ohmic reflective layer 19 may be disposed under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light thereon from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 disposed under the ohmic reflective layer 19 may be electrically connected to the first conductive semiconductor layer 11 disposed on the ohmic reflective layer 19.

The second electrode 87 according to the embodiment may comprise at least one of the ohmic reflective layer 19 and the first metal layer 35. In the light emitting device according to the embodiment, the conductive support member 70 disposed under the second electrode 87 may be electrically connected to the first conductive semiconductor layer 11 disposed on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. The second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Figure 10:
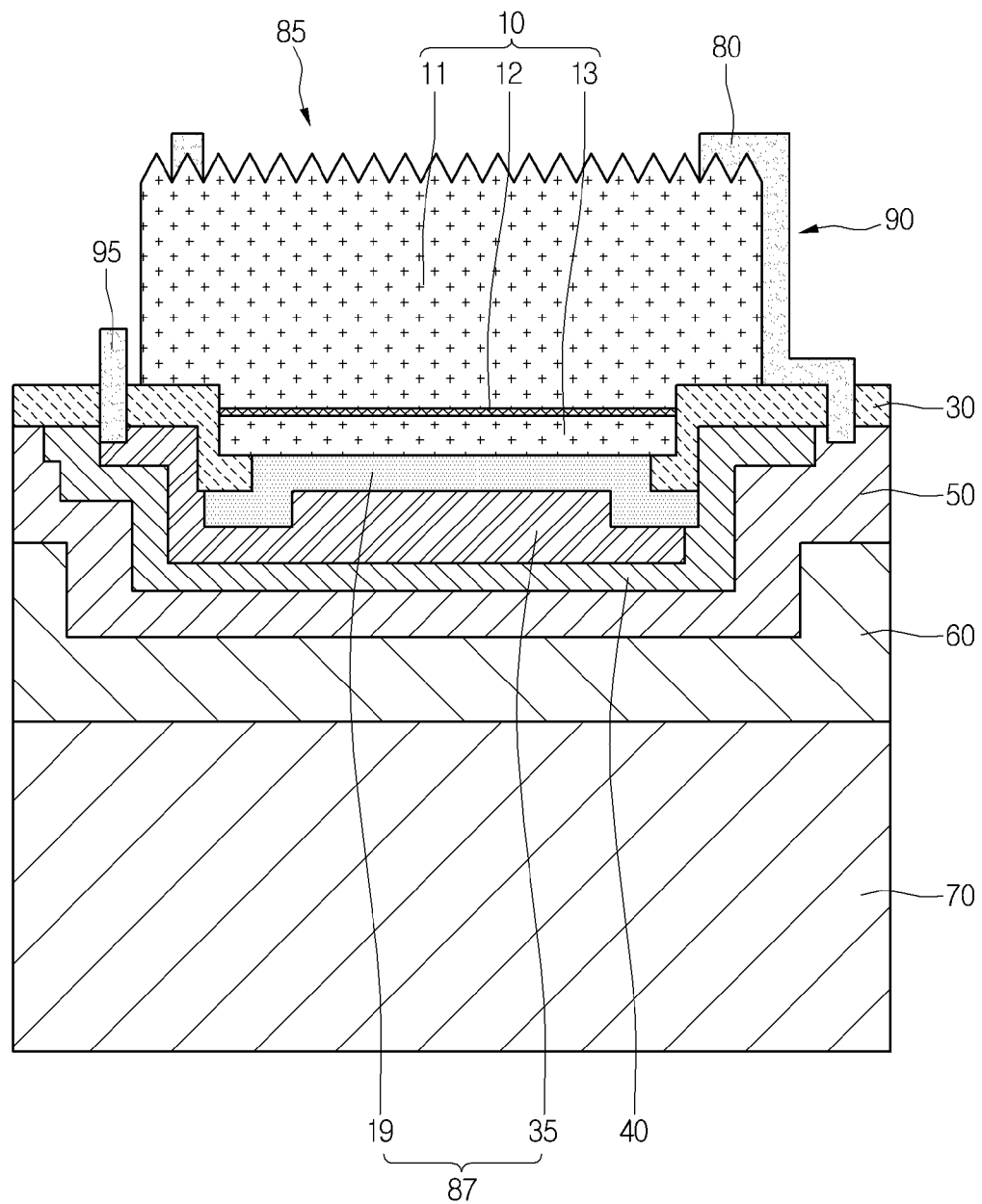

FIG. 10 is a sectional view showing still another example of a light emitting device according to the embodiment. In the following description about the light emitting device shown in FIG. 10, components and structures the same as those described with reference to FIG. 1 will not be further described in order to avoid redundancy.

According to the light emitting device of the embodiment, the ohmic reflective layer 19 may be disposed under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light thereon from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 disposed under the ohmic reflective layer 19 may be electrically connected to the first conductive semiconductor layer 11 disposed on the ohmic reflective layer 19.

The second electrode 87 according to the embodiment may comprise at least one of the ohmic reflective layer 19 and the first metal layer 35. In the light emitting device according to the embodiment, the conductive support member 70 disposed under the second electrode 87 may be electrically connected to the first conductive semiconductor layer 11 disposed on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. The second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Figure 11:
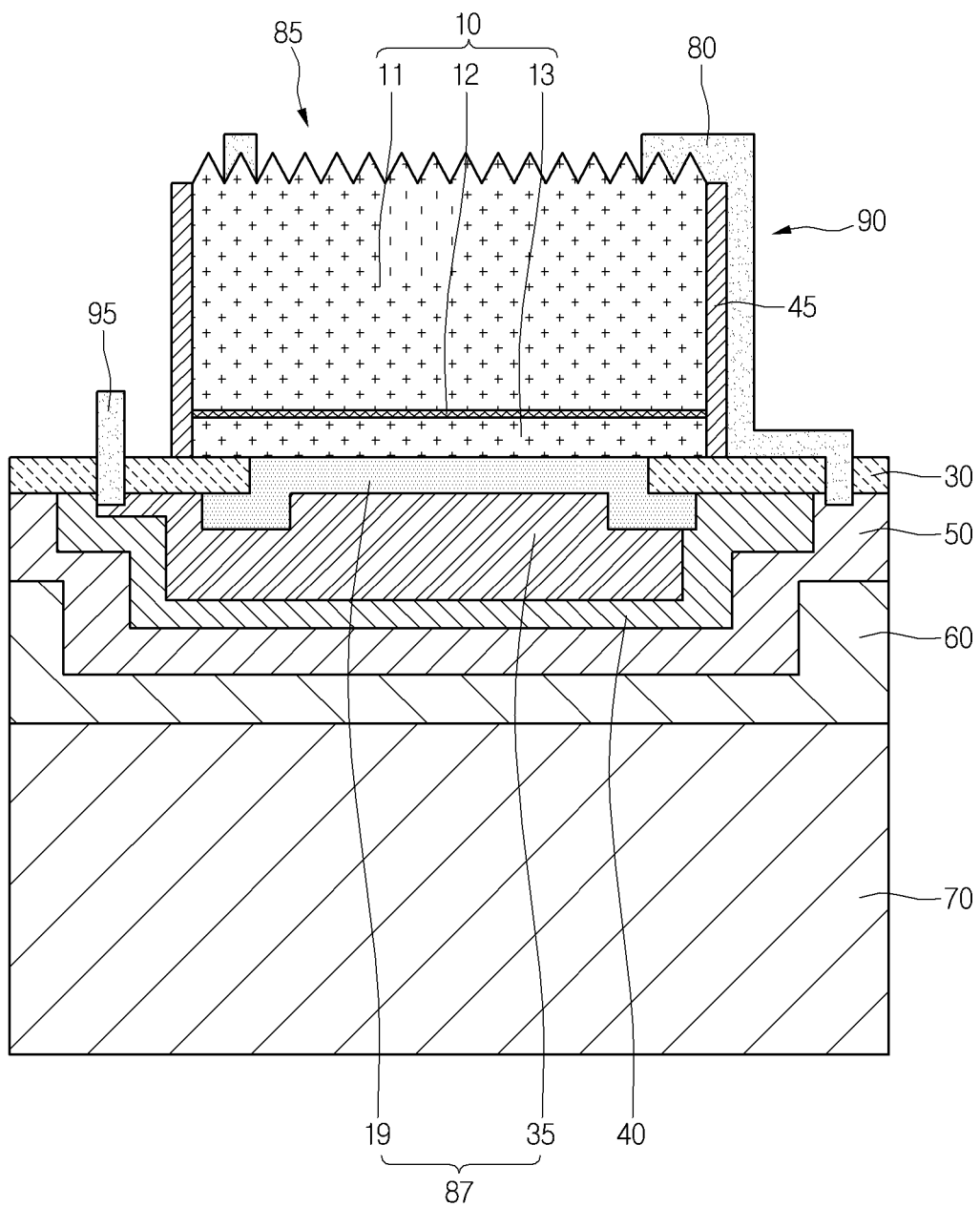

FIG. 11 is a sectional view showing still another example of a light emitting device according to the embodiment. In the following description about the light emitting device shown in FIG. 11, components and structures the same as those described with reference to FIG. 8 will not be further described in order to avoid redundancy.

According to the light emitting device of the embodiment, the ohmic reflective layer 19 may be disposed under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light thereon from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 disposed under the ohmic reflective layer 19 may be electrically connected to the first conductive semiconductor layer 11 disposed on the ohmic reflective layer 19.

The second electrode 87 according to the embodiment may comprise at least one of the ohmic reflective layer 19 and the first metal layer 35. In the light emitting device according to the embodiment, the conductive support member 70 disposed under the second electrode 87 may be electrically connected to the first conductive semiconductor layer 11 disposed on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. The second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

Figure 12:
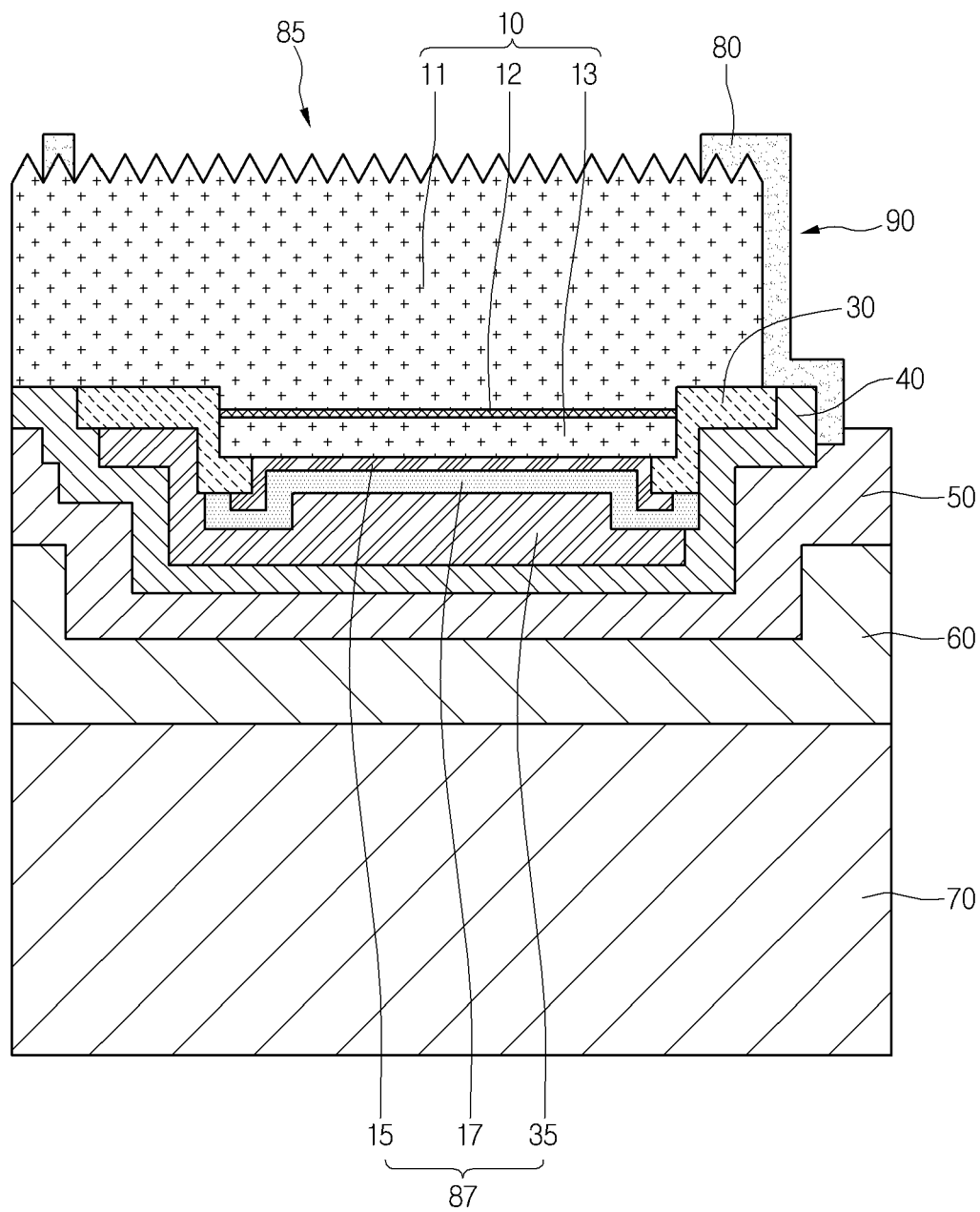
FIG. 12 is a sectional view showing another example of the light emitting device according to the embodiment.

FIG. 12 is a sectional view showing still another example of a light emitting device according to the embodiment. In the following description about the light emitting device shown in FIG. 12, components and structures the same as those described with reference to FIGS. 1 to 11 will not be further described in order to avoid redundancy.

As shown in FIG. 12, the light emitting device according to the embodiment may comprise the light emitting structure 10, the conductive support member 70, the first electrode 80, and the second electrode 87.

The light emitting structure 10 may comprise the first conductive semiconductor layer 11, the active layer 12, and the second conductive semiconductor layer 13. The active layer 12 may be disposed between the first conductive semiconductor layer 11 and the second conductive semiconductor layer 13. The active layer 12 may be disposed under the first conductive semiconductor layer 11, and the second conductive semiconductor layer 13 may be disposed under the active layer 12.

The light emitting device according to the embodiment may comprise the channel layer 30 disposed at the peripheral portion of the lower portion of the light emitting structure 10. For example, the top surface the channel layer 30 may be disposed higher than the top surface of the active layer 12. The channel layer 30 may surround the active layer 12. The channel layer 30 may surround a peripheral portion of the second conductive semiconductor layer 13. One end of the channel layer 30 may be disposed under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the second electrode 87. The one end of the channel layer 30 may be disposed between the second conductive semiconductor layer 13 and the reflective layer 17.

For example, the channel layer 30 may be realized by using an oxide or a nitride. For example, the channel layer 30 may comprise at least one selected from the group consisting of $SiO_2$, $SiO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The first electrode 80 may be electrically connected to the first conductive semiconductor layer 11. The first electrode 80 may be disposed on the first conductive semiconductor layer 11. The first electrode 80 may make contact with the first conductive semiconductor layer 11. The reflective layer 17 may be electrically connected to the second conductive semiconductor layer 13. The reflective layer 17 may be disposed under the light emitting structure 10. The reflective layer 17 may be disposed under the second conductive semiconductor layer 13.

The light emitting device according to the embodiment may comprise the ohmic contact layer 15 disposed between the reflective layer 17 and the second conductive semiconductor layer 13. The ohmic contact layer 15 may contact with the second conductive semiconductor layer 13.

The ohmic contact layer 15 may make ohmic contact with the light emitting structure 10. The ohmic contact layer 15 may comprise an ohmic contact region with the light emitting structure 10. The reflective layer 17 may be electrically connected to the second conductive semiconductor layer 13. In addition, the reflective layer 17 reflects light incident thereto from the light emitting structure 10 to increase the quantity of light extracted to an outside. For example, the ohmic contact layer 15 may comprise a transparent conductive oxide layer. The reflective layer 17 may comprise a material having high reflectance.

The light emitting device according to the embodiment may comprise the first metal layer 35 disposed under the reflective layer 17. The first metal layer 35 may comprise at least one of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35. For example, the second electrode 87 may comprise all of the reflective layer 17, the first metal layer 35, and the ohmic contact layer 15, or may comprise one or two selected from the of the reflective layer 17, the first metal layer 35, and the ohmic contact layer 15.

The light emitting device according to the embodiment may comprise the second metal layer 50 disposed under the first metal layer 35.

The second metal layer 50 may comprise at least one of Cu, Ni, Ti, Ti—W, Cr, W, Pt, V, Fe, and Mo. The second metal layer 50 may serve as a diffusion barrier layer. The bonding layer 60 and the conductive support member 70 may be disposed under the second metal layer 50.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, power may be applied to the light emitting structure 10 through the second electrode 87 and the first electrode 80. According to the embodiment, the first electrode 80 may comprise an ohmic layer, an intermediate layer, and an upper layer. The ohmic layer may comprise a material selected from the group consisting of Cr, V, W, Ti, and Zn to make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

A roughness 85 may be formed on the top surface of the first conductive semiconductor layer 11. Accordingly, the quantity of light extracted upward at the region where the roughness 85 is formed can be increased.

The light emitting device according to the embodiment may comprise the insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The top surface of the insulating layer 40 may be exposed to a peripheral portion of the lower portion of the light emitting structure 10. The insulating layer 40 may surround a peripheral portion of the channel layer 30.

The light emitting device according to the embodiment may comprise the first connection part 90 and the second connection part 95. The first connection part 90 may be electrically connected to the first electrode 80 and the conductive support member 70. The second connection part 95 may be electrically connected to the reflective layer 17. The second connection part 95 may electrically connected to the second electrode 87.

Figure 13:
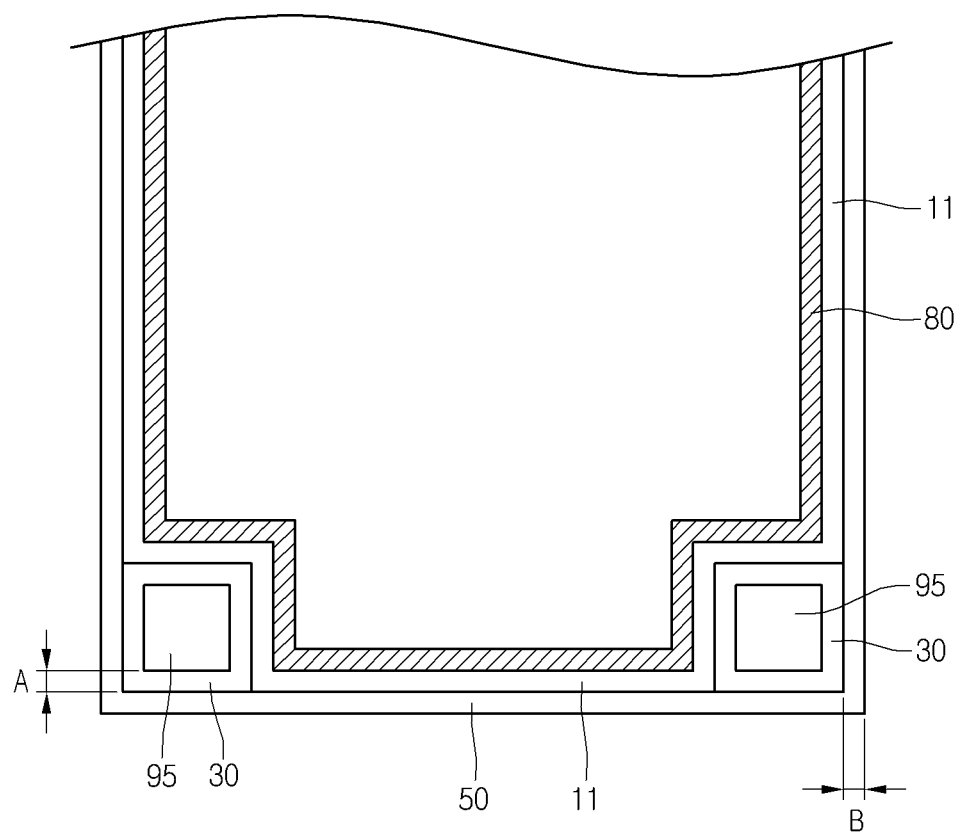
FIG. 13 is a view showing an example of a second connection part of the light emitting device of the embodiment.

As shown in FIG. 13, the light emitting device according to the embodiment may comprise the second connection part 95. The second connection part 95 may electrically connected to the second electrode 87. FIG. 13 is a view showing an example of the second connection part of the light emitting device according to the embodiment.

One end of the second connection part 95 may be disposed on the channel layer 30. The second connection part 95 may make contact with the first metal layer 35, and may make contact with the reflective layer 17.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection part 90 may be disposed through the insulating layer 400. The first connection part 90 may be electrically connected to the conductive support member 70 through the insulating layer 40. In addition, the first connection part 90 may be electrically connected to the second metal layer 50 through the channel layer 30. The first connection part 90 may be electrically connected to the second metal layer 50 through the channel layer 30 and the insulating layer 40.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm. Accordingly, the first connection part 90 may electrically stably insulate the active layer 12.

The second connection part 95 may be electrically connected to the first metal layer 35. The second connection part 95 may make contact with the first metal layer 35. One end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10.

The second connection part 95 may be electrically connected to the first metal layer 35 through the channel layer 30. In addition, the second connection part 95 may be electrically connected to the first metal layer 35 through the insulating layer 40. The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

According to the light emitting device of the embodiment, the light emitting structure 10 disposed on the upper portion of the light emitting device has the same polarity as those of the second metal layer 50, the bonding layer 60, and the conductive support substrate 70 disposed at the lower portion of the light emitting structure. Accordingly, as shown in FIG. 13, one lateral side of the light emitting structure 10 may be disposed at a predetermined distance B or less from one vertical-directional lateral side of the second metal layer 50 or the conductive support member 70. The one lateral side of the light emitting structure 10 may be aligned at a distance of 20 μm from the vertical-directional lateral side of the second metal layer 50 or the conductive support member 70. In other words, according to the embodiment, even if the lateral side of the light emitting structure 10 is vertically aligned with the lateral side of the second metal layer 50 or the conductive support member 70 at the distance of 20 μm or less from a vertical plane, the electric short between the lateral side of the light emitting structure 10 and the lateral side of the second metal layer 50 or the conductive support member 70 can be prevented. In addition, one lateral side of the light emitting structure 10 may be aligned in line with one lateral side of the second metal layer 50 or the conductive support member 70 in the vertical direction.

According to the light emitting structure of the related art, in order to ensure electrical reliability, the lateral side of the light emitting structure may be disposed at the distance in the range of 50 μm to 70 μm from a vertical surface corresponding to the lateral side of the conductive support member. However, according to the light emitting device of the embodiment, the lateral side of the light emitting structure 10 may be disposed at the distance of about 20 or less from the lateral side of the conductive support member 70.

Accordingly, when comparing with the light emitting device according to the related art, the area of the light emitting structure 10 can be enlarged.

In addition, according to the embodiment, as shown in FIG. 13, an outer surface of the first conductive semiconductor layer 11 may protrude out of an outer surface of the top surface of the first connection part 90 by a predetermined distance A. For example, the outer surface of the first conductive semiconductor layer 11 may protrude from the outer surface of the first connection part 90 by the distance of 10 μm or more.

Accordingly, when comparing with the light emitting device according to the related art, the light emitting structure 10 according to the embodiment may be formed with a wider area. Accordingly, since the light emitting structure 10 according to the embodiment may comprise a wider semiconductor layer, light may be emitted from a wider area, and light extraction can be improved.

Hereinafter, a method of fabricating a light emitting device according to the embodiment will be described with reference to FIGS. 14 to 18. In the following description about the method of fabricating the light emitting device according to the embodiment with reference to FIGS. 14 to 18, components and structures the same as those described with reference to FIGS. 1 to 11 will be described in brief or will not be described.

Figure 14:
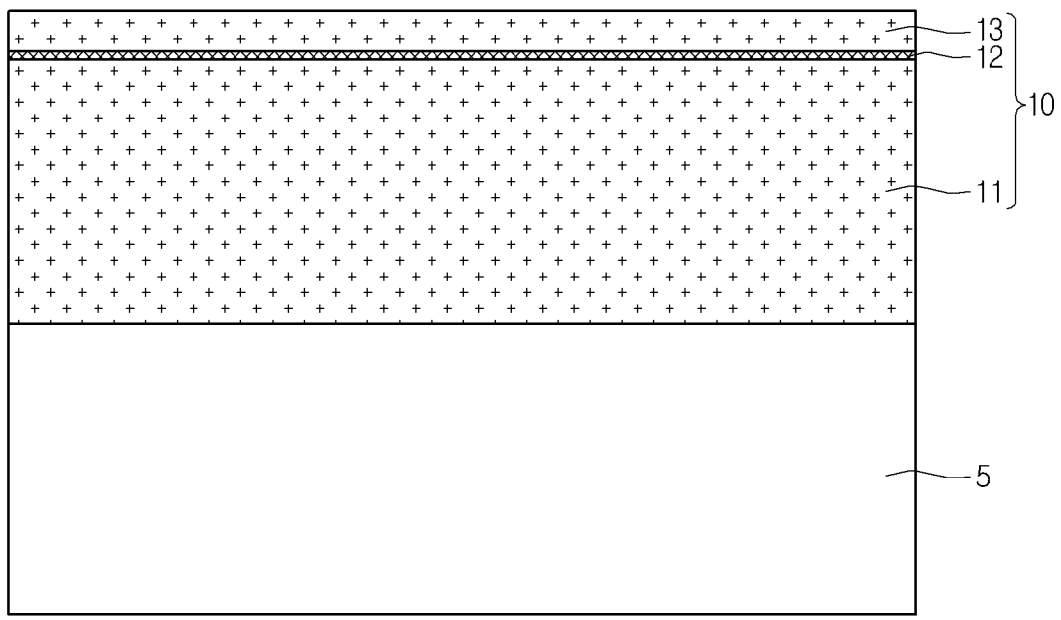
FIGS. 14 to 18 are sectional views showing a method of fabricating a light emitting device according to the embodiment.

According to the method of fabricating the light emitting device of the embodiment, as shown in FIG. 14, the first conductive semiconductor layer 11, the active layer 12, and the second conductive semiconductor layer 13 may be formed on the substrate 5. The first conductive semiconductor layer 11, the active layer 12, and the second conductive semiconductor layer 13 may be defined as the light emitting structure 10.

Figure 15:
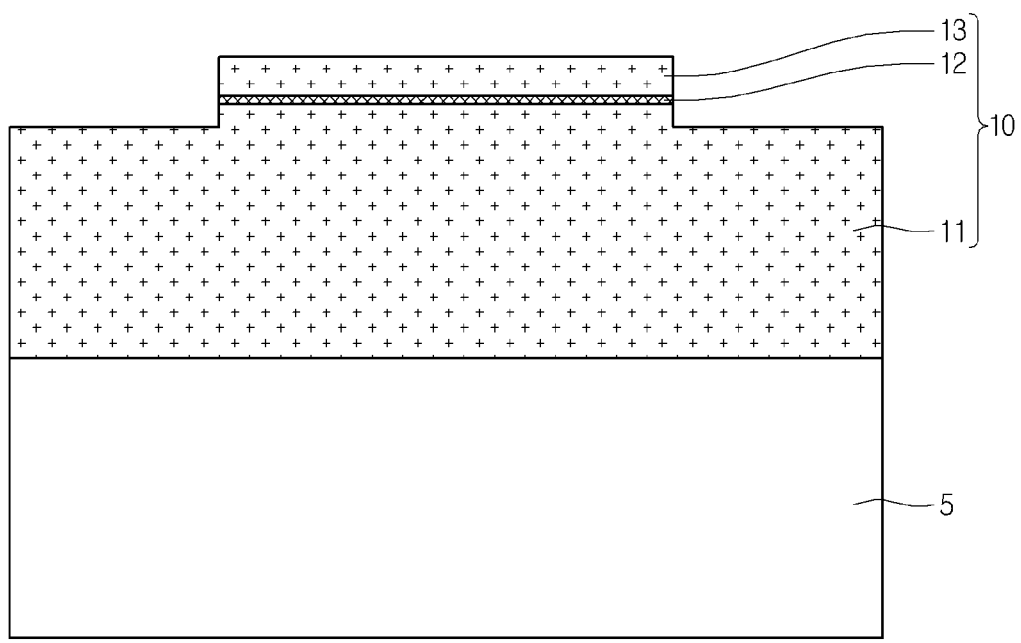

Next, as shown in FIG. 15, a portion of the first conductive semiconductor layer 11 may be exposed by performing an etching scheme for the light emitting structure 10. In this case, the etching may comprise a wet etching scheme or a dry etching scheme.

Figure 16:
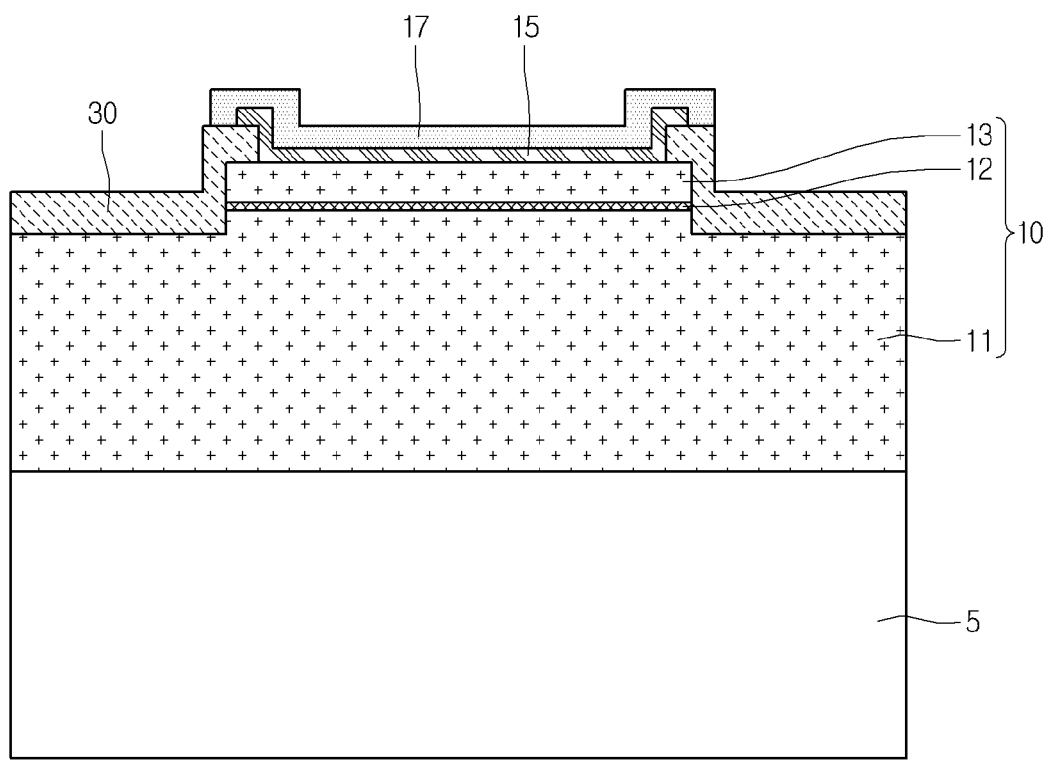

Next, as shown in FIG. 16, the light emitting structure 10 may be disposed therein with the channel layer 30, the ohmic contact layer 15, and the reflective layer 17.

For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The ohmic contact layer 15 may be disposed between the reflective layer 17 and the second conductive semiconductor layer 13. The ohmic contact layer 15 may make contact with the second conductive semiconductor layer 13.

The ohmic contact layer 15 may make contact with the light emitting structure 10. The reflective layer 17 may be electrically connected to the second conductive semiconductor layer 13. The ohmic contact layer 15 may comprise an ohmic-contact region with the light emitting structure 10. The reflective layer 17 may comprise a material having high reflectance. For example, the reflective layer 17 may have a structure in which an Ag layer and a Ni layer are alternately formed, and may comprise Ni/Ag/Ni or a TI layer, and a Pt layer. In addition, the ohmic contact layer 15 may be disposed under the reflective layer 17, and at least a portion of the ohmic contact layer 15 may make ohmic contact with the light emitting structure 10 through the reflective layer 17.

Figure 17:
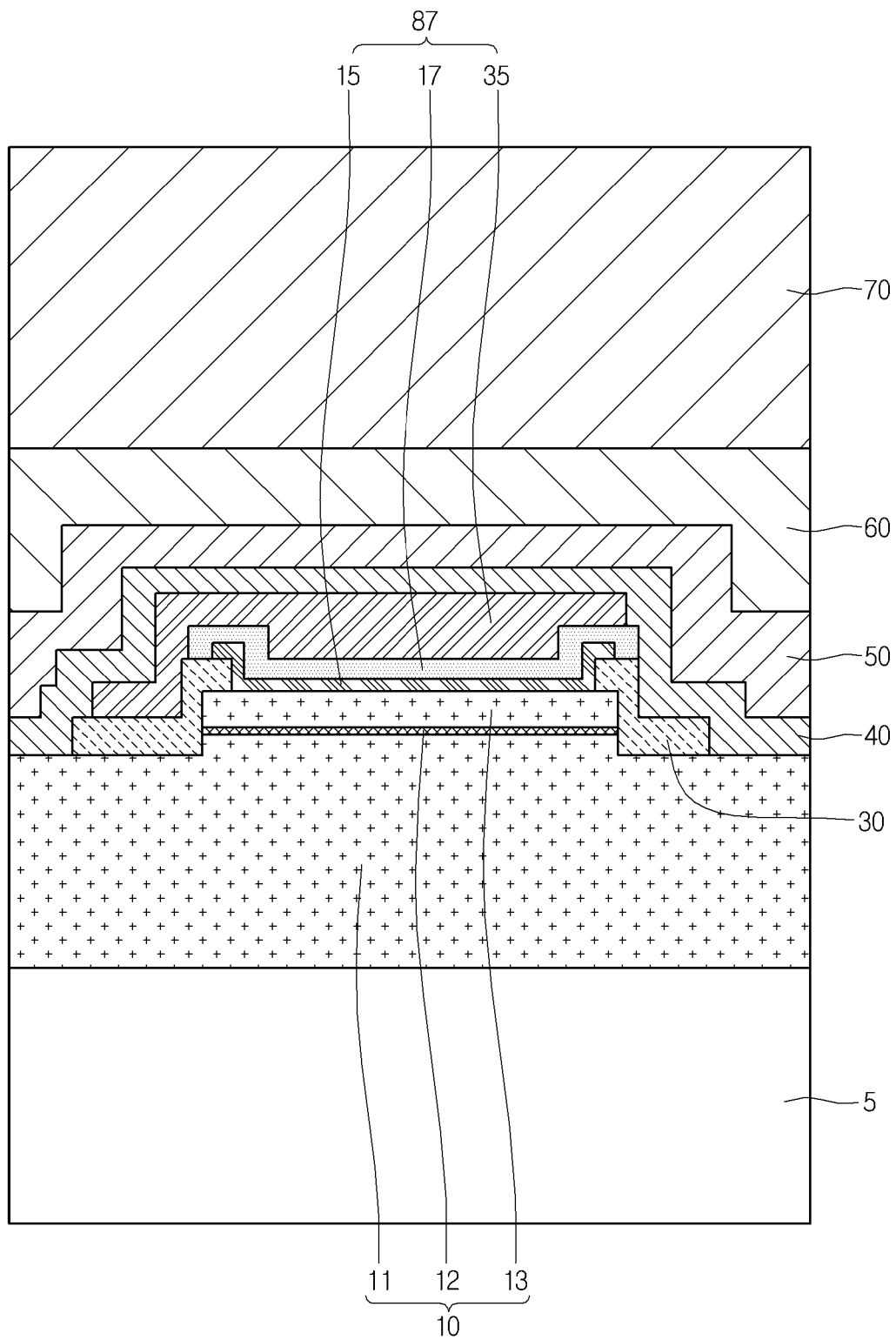

Thereafter, as shown in FIG. 17, the first metal layer 35, the insulating layer 40, the second metal layer 50, the bonding layer 60, and the conductive support member 70 may be formed on the reflective layer 17.

The first metal layer 35 may comprise at least one of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35. For example, the second electrode 87 may comprise all of the reflective layer 17, the first metal layer 35, and the ohmic contact layer 15, or may comprise one or two selected from the of the reflective layer 17, the first metal layer 35, and the ohmic contact layer 15.

The insulating layer 40 may insulate the first metal layer 35 from the second metal layer 50. The insulating layer 40 may insulate the first metal layer 35 from the conductive support member 70.

The insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The second metal layer 50 may comprise at least one of Cu, Ni, Ti, Ti—W, Cr, W, Pt, V, Fe, and Mo. The second metal layer 50 may serve as a diffusion barrier layer.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

Next, the substrate 5 is removed from the first conductive semiconductor layer 11. According to one example, the substrate 5 may be removed through a laser lift off (LLO) process. The LLO process is a process to laminate the substrate 5 from the first conductive semiconductor layer 11 by irradiating a laser to the bottom surface of the substrate 5.

Figure 18:
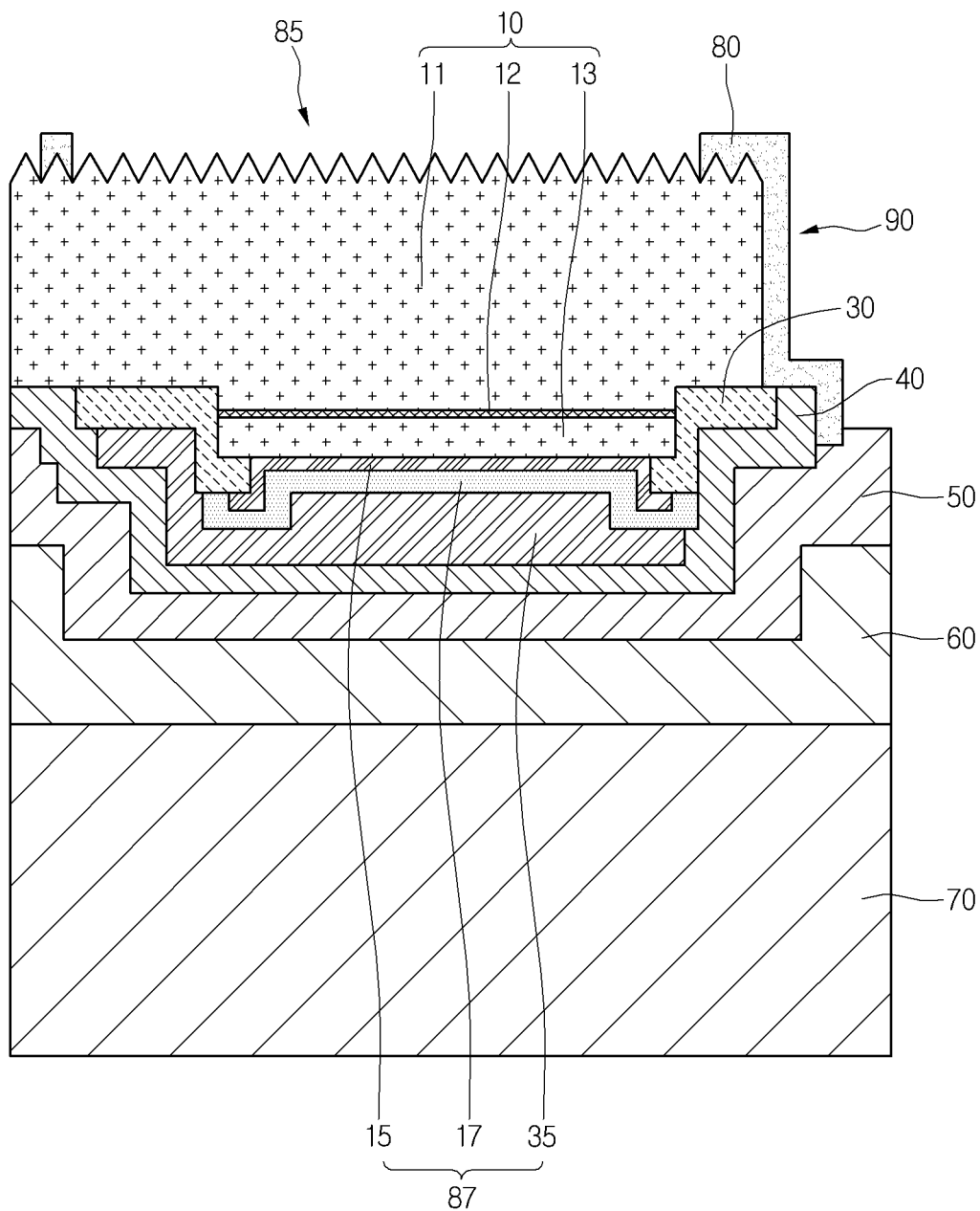

In addition, as shown in FIG. 18, the lateral side of the light emitting structure 10 is etched through an isolation etching process to expose portions of the channel layer 30 and the insulating layer 40. In this case, a portion of the insulating layer 40 may be exposed. The isolation etching process may be performed through a dry etching process such as an inductively coupled plasma (ICP), but the embodiment is not limited thereto.

The roughness 85 may be formed on the top surface of the first conductive semiconductor layer 11. Accordingly, a light extraction pattern may be disposed on the light emitting structure 10. A concave-convex pattern may be disposed on the light emitting structure 10. For example, the light extraction pattern provided on the light emitting structure 10 may be formed through a PEC (photo electro chemical) etching process. Therefore, according to the embodiment, the external light extraction effect can be increased.

Next, as shown in FIG. 18, the light emitting structure 10 may be disposed thereon with the first electrode 80, the first connection part 90, and the second connection part 95.

The first electrode 80 may be electrically connected to the first conductive semiconductor layer 11. A portion of the first electrode 80 may make contact with the first conductive semiconductor layer 11. According to the embodiment, power may be applied to the light emitting structure 10 through the first electrode 80 and the second electrode 87.

The first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, and Au.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

In this case, as shown in FIG. 13, one end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30. In addition, the second connection part 95 may be electrically connected to the first metal layer 35 through the insulating layer 40. The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

According to the light emitting device of the embodiment, the light emitting structure 10 disposed on the upper portion of the light emitting device has the same polarity as those of the second metal layer 50, the bonding layer 60, and the conductive support substrate 70 disposed at the lower portion of the light emitting structure. Accordingly, as shown in FIG. 2, one lateral side of the light emitting structure 10 may be disposed at a predetermined distance B or less from one vertical-directional lateral side of the conductive support member 70. For example, the one lateral side of the light emitting structure 10 may be aligned at a distance of 20 μm from the one vertical-directional lateral side of the conductive support member 70. In other words, according to the embodiment, even if the lateral side of the light emitting structure 10 is vertically aligned with the lateral side of the second metal layer 50 or the conductive support member 70 at the distance of 20 μm or less from a vertical plane, the electric short between the lateral side of the light emitting structure 10 and the lateral side of the conductive support member 70 can be prevented. In addition, one lateral side of the light emitting structure 10 may be aligned in line with one lateral side of the conductive support member 70 in the vertical direction.

According to the light emitting structure of the related art, in order to ensure electrical reliability, the lateral side of the light emitting structure may be disposed at the distance in the range of 50 μm to 70 μm from a vertical surface corresponding to the lateral side of the conductive support member. However, according to the light emitting device of the embodiment, the lateral side of the light emitting structure 10 may be disposed at the distance of about 20 or less from the lateral side of the conductive support member 70. Accordingly, when comparing with the light emitting device according to the related art, the area of the light emitting structure 10 can be enlarged.

In addition, according to the embodiment, as shown in FIG. 14, an outer surface of the first conductive semiconductor layer 11 may protrude out of an outer surface of the top surface of the first connection part 90 by a predetermined distance A. For example, the outer surface of the first conductive semiconductor layer 11 may protrude from the outer surface of the first connection part 90 by the distance of 10 μm or more.

Accordingly, when comparing with the light emitting device according to the related art, the light emitting structure 10 according to the embodiment may be formed with a wider area. Accordingly, since the light emitting structure 10 according to the embodiment may comprise a wider semiconductor layer, light may be emitted from a wider area, and light extraction can be improved.

Meanwhile, the process of forming each layer described above is provided for the illustrative purpose, and the process sequence thereof may be variously modified.

Figure 19:
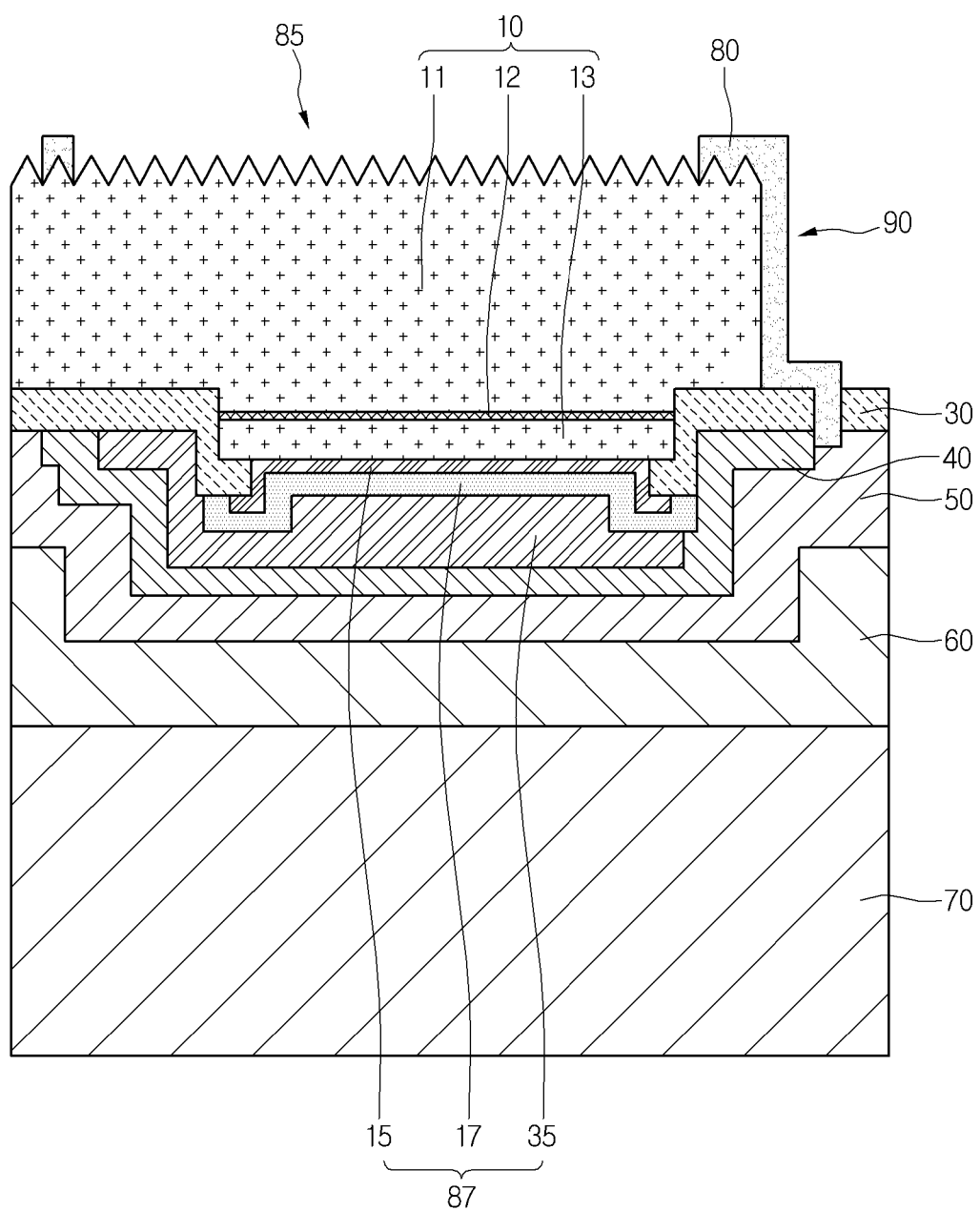

FIG. 19 is a sectional view showing still another example of a light emitting device according to the embodiment. In the following description about the light emitting device shown in FIG. 19, components and structures the same as those described with reference to FIG. 12 will not be further described in order to avoid redundancy.

According to the embodiment shown in FIG. 19, the channel layer 30 is disposed at the peripheral portion of the lower portion of the light emitting structure 10, and the insulating layer 40 may not be exposed to the peripheral portion of the lower portion of the light emitting structure 10.

The light emitting device according to the embodiment may comprise the channel layer 30 disposed at the peripheral portion of the lower portion of the light emitting structure 10. For example, the top surface the channel layer 30 may be disposed higher than the top surface of the active layer 12. The channel layer 30 may surround the active layer 12. The channel layer 30 may surround a peripheral portion of the second conductive semiconductor layer 13. One end of the channel layer 30 may be disposed under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the reflective layer 17.

The light emitting device according to the embodiment may comprise an insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and MN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The light emitting device according to the embodiment may comprise the first connection part 90 and the second connection part 95. The first connection part 90 may be electrically connected to the first electrode 80 and the conductive support member 70.

The first connection part 90 may make contact with the first electrode 80. The first connection part 90 may be electrically connected to the second metal layer 50. The first connection part 90 may make contact with the second metal layer 50. The first connection part 90 may be electrically connected to the conductive support member 70 through the second metal layer 50 and the bonding layer 60. The first connection part 90 may be disposed through the channel layer 30. The first connection part 90 may be electrically connected to the conductive support member 70 through the channel layer 30.

The first connection part 90 may be disposed at the lateral side of the light emitting structure 10. The first connection part 90 may be disposed at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

As shown in FIG. 13, one end of the second connection part 95 may be disposed on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30. In addition, the second connection part 95 may be electrically connected to the first metal layer 35 through the insulating layer 40. The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the first connection part 90 may be electrically connected to the first conductive semiconductor layer 11 disposed on the second electrode 87 through the conductive support member 70 disposed under the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

According to the light emitting device of the embodiment, the light emitting structure 10 disposed on the upper portion of the light emitting device has the same polarity as those of the second metal layer 50, the bonding layer 60, and the conductive support substrate 70 disposed at the lower portion of the light emitting structure. Accordingly, as shown in FIG. 13, one lateral side of the light emitting structure 10 may be disposed at a predetermined distance B or less from one vertical-directional lateral side of the conductive support member 70. For example, the one lateral side of the light emitting structure 10 may be aligned at a distance of 20 μm from the one vertical-directional lateral side of the conductive support member 70. In other words, according to the embodiment, even if the lateral side of the light emitting structure 10 is vertically aligned with the lateral side of the second metal layer 50 or the conductive support member 70 at the distance of 20 μm or less from a vertical plane, the electric short between the lateral side of the light emitting structure 10 and the lateral side of the conductive support member 70 can be prevented. In addition, one lateral side of the light emitting structure 10 may be aligned in line with one lateral side of the conductive support member 70 in the vertical direction.

According to the light emitting structure of the related art, in order to ensure electrical reliability, the lateral side of the light emitting structure may be disposed at the distance in the range of 50 μm to 70 μm from a vertical surface corresponding to the lateral side of the conductive support member. However, according to the light emitting device of the embodiment, the lateral side of the light emitting structure 10 may be disposed at the distance of about 20 or less from the lateral side of the conductive support member 70. Accordingly, when comparing with the light emitting device according to the related art, the area of the light emitting structure 10 can be enlarged.

In addition, according to the embodiment, as shown in FIG. 13, an outer surface of the first conductive semiconductor layer 11 may protrude out of an outer surface of the top surface of the first connection part 90 by a predetermined distance A. For example, the outer surface of the first conductive semiconductor layer 11 may protrude from the outer surface of the first connection part 90 by the distance of 10 μm or more.

Accordingly, when comparing with the light emitting device according to the related art, the light emitting structure 10 according to the embodiment may be formed with a wider area. Accordingly, since the light emitting structure 10 according to the embodiment may comprise a wider semiconductor layer, light may be emitted from a wider area, and light extraction can be improved.

Figure 20:
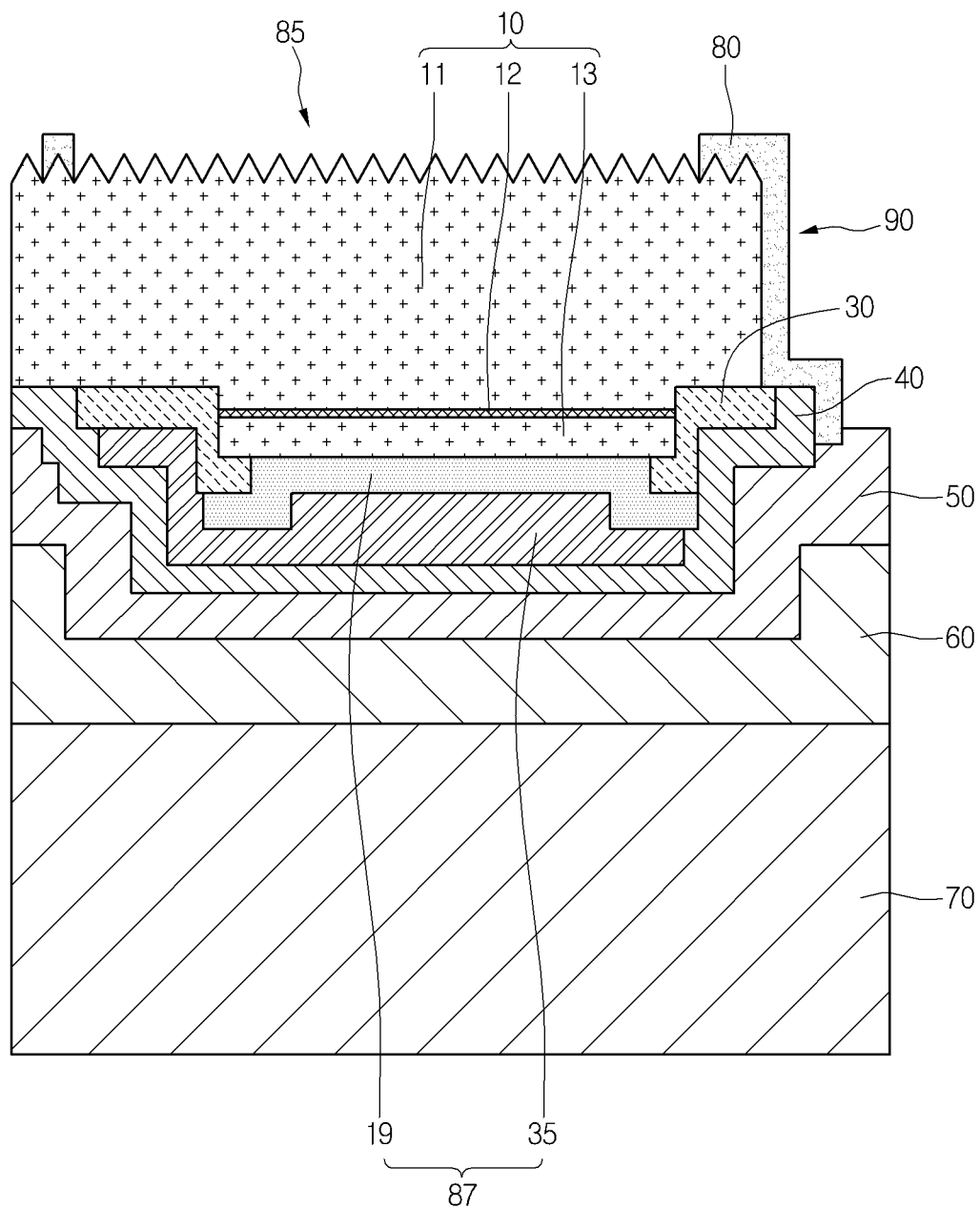

FIG. 20 is a sectional view showing still another example of a light emitting device according to the embodiment. In the following description about the light emitting device shown in FIG. 20, components and structures the same as those described with reference to FIG. 12 will not be further described in order to avoid redundancy.

According to the light emitting device of the embodiment, an ohmic reflective layer 19 may be disposed under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light thereon from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 disposed under the ohmic reflective layer 19 may be electrically connected to the first conductive semiconductor layer 11 disposed on the ohmic reflective layer 19.

The second electrode 87 according to the embodiment may comprise at least one of the ohmic reflective layer 19 and the first metal layer 35. In the light emitting device according to the embodiment, the conductive support member 70 disposed under the second electrode 87 may be electrically connected to the first conductive semiconductor layer 11 disposed on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. The second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

According to the light emitting device of the embodiment, the light emitting structure 10 disposed on the upper portion of the light emitting device has the same polarity as those of the second metal layer 50, the bonding layer 60, and the conductive support substrate 70 disposed at the lower portion of the light emitting structure. Accordingly, as shown in FIG. 2, one lateral side of the light emitting structure 10 may be disposed at a predetermined distance B or less from one vertical-directional lateral side of the conductive support member 70. For example, the one lateral side of the light emitting structure 10 may be aligned at a distance of 20 μm from the one vertical-directional lateral side of the conductive support member 70. In other words, according to the embodiment, even if the lateral side of the light emitting structure 10 is vertically aligned with the lateral side of the second metal layer 50 or the conductive support member 70 at the distance of 20 μm or less from a vertical plane, the electric short between the lateral side of the light emitting structure 10 and the lateral side of the conductive support member 70 can be prevented. In addition, one lateral side of the light emitting structure 10 may be aligned in line with one lateral side of the conductive support member 70 in the vertical direction.

According to the light emitting structure of the related art, in order to ensure electrical reliability, the lateral side of the light emitting structure may be disposed at the distance in the range of 50 μm to 70 μm from a vertical surface corresponding to the lateral side of the conductive support member. However, according to the light emitting device of the embodiment, the lateral side of the light emitting structure 10 may be disposed at the distance of about 20 or less from the lateral side of the conductive support member 70. Accordingly, when comparing with the light emitting device according to the related art, the area of the light emitting structure 10 can be enlarged.

In addition, according to the embodiment, as shown in FIG. 13, an outer surface of the first conductive semiconductor layer 11 may protrude out of an outer surface of the top surface of the first connection part 90 by a predetermined distance A. For example, the outer surface of the first conductive semiconductor layer 11 may protrude from the outer surface of the first connection part 90 by the distance of 10 μm or more.

Accordingly, when comparing with the light emitting device according to the related art, the light emitting structure 10 according to the embodiment may be formed with a wider area. Accordingly, since the light emitting structure 10 according to the embodiment may comprise a wider semiconductor layer, light may be emitted from a wider area, and light extraction can be improved.

Figure 21:
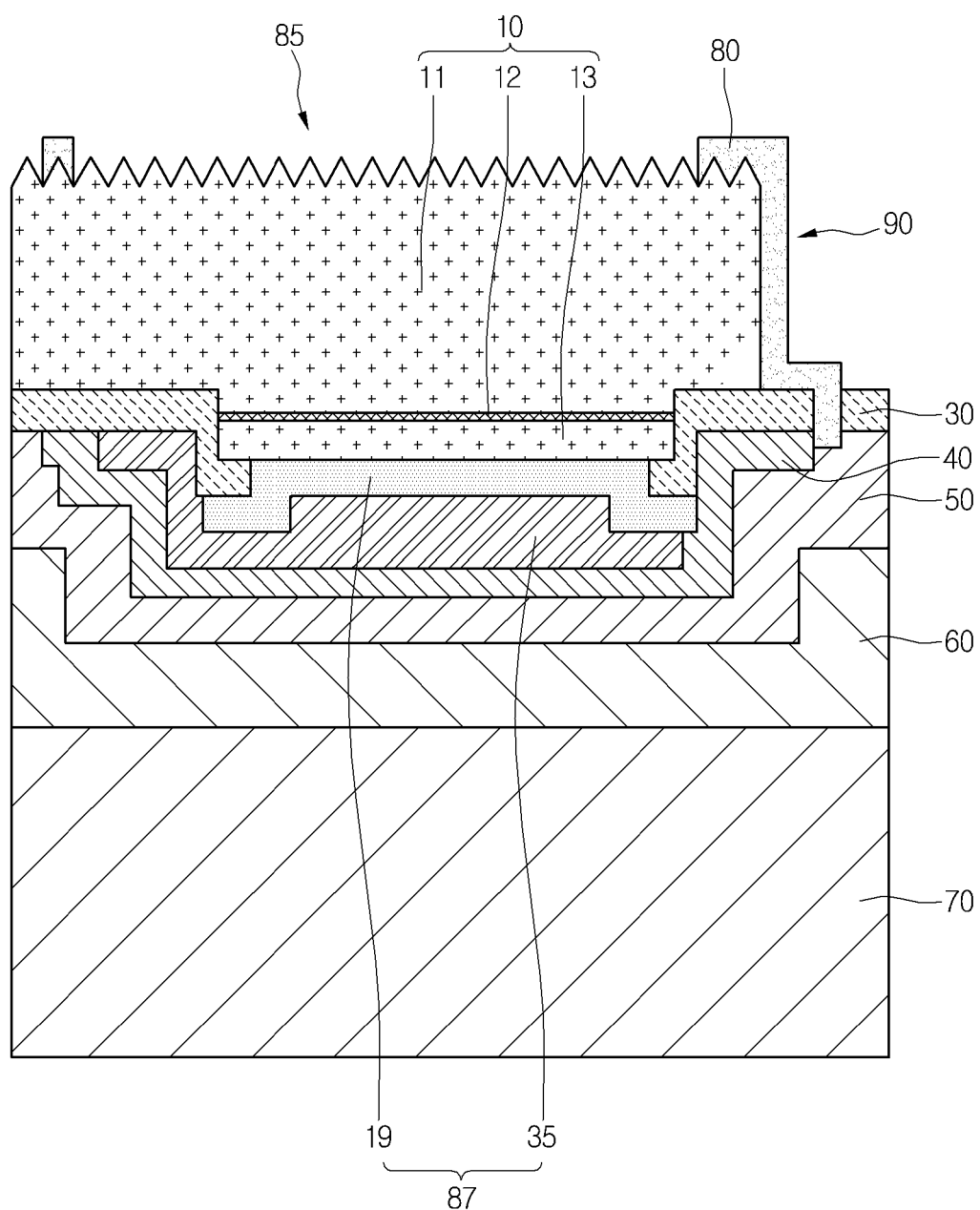

FIG. 21 is a sectional view showing still another example of a light emitting device according to the embodiment. In the following description about the light emitting device shown in FIG. 21, components and structures the same as those described with reference to FIG. 19 will not be further described in order to avoid redundancy.

According to the light emitting device of the embodiment, the ohmic reflective layer 19 may be disposed under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light thereon from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 disposed under the ohmic reflective layer 19 may be electrically connected to the first conductive semiconductor layer 11 disposed on the ohmic reflective layer 19.

The second electrode 87 according to the embodiment may comprise at least one of the ohmic reflective layer 19 and the first metal layer 35. In the light emitting device according to the embodiment, the conductive support member 70 disposed under the second electrode 87 may be electrically connected to the first conductive semiconductor layer 11 disposed on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. The second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

According to the light emitting device of the embodiment, the light emitting structure 10 disposed on the upper portion of the light emitting device has the same polarity as those of the second metal layer 50, the bonding layer 60, and the conductive support substrate 70 disposed at the lower portion of the light emitting structure. Accordingly, as shown in FIG. 13, one lateral side of the light emitting structure 10 may be disposed at a predetermined distance B or less from one vertical-directional lateral side of the conductive support member 70. For example, the one lateral side of the light emitting structure 10 may be aligned at a distance of 20 μm from the one vertical-directional lateral side of the conductive support member 70. In other words, according to the embodiment, even if the lateral side of the light emitting structure 10 is vertically aligned with the lateral side of the second metal layer 50 or the conductive support member 70 at the distance of 20 μm or less from a vertical plane, the electric short between the lateral side of the light emitting structure 10 and the lateral side of the conductive support member 70 can be prevented. In addition, one lateral side of the light emitting structure 10 may be aligned in line with one lateral side of the conductive support member 70 in the vertical direction.

According to the light emitting structure of the related art, in order to ensure electrical reliability, the lateral side of the light emitting structure may be disposed at the distance in the range of 50 μm to 70 μm from a vertical surface corresponding to the lateral side of the conductive support member. However, according to the light emitting device of the embodiment, the lateral side of the light emitting structure 10 may be disposed at the distance of about 20 or less from the lateral side of the conductive support member 70. Accordingly, when comparing with the light emitting device according to the related art, the area of the light emitting structure 10 can be enlarged.

In addition, according to the embodiment, as shown in FIG. 13, an outer surface of the first conductive semiconductor layer 11 may protrude out of an outer surface of the top surface of the first connection part 90 by a predetermined distance A. For example, the outer surface of the first conductive semiconductor layer 11 may protrude from the outer surface of the first connection part 90 by a 10 μm or more.

Accordingly, when comparing with the light emitting device according to the related art, the light emitting structure 10 according to the embodiment may be formed with a wider area. Accordingly, since the light emitting structure 10 according to the embodiment may comprise a wider semiconductor layer, light may be emitted from a wider area, and light extraction can be improved.

Figure 22:
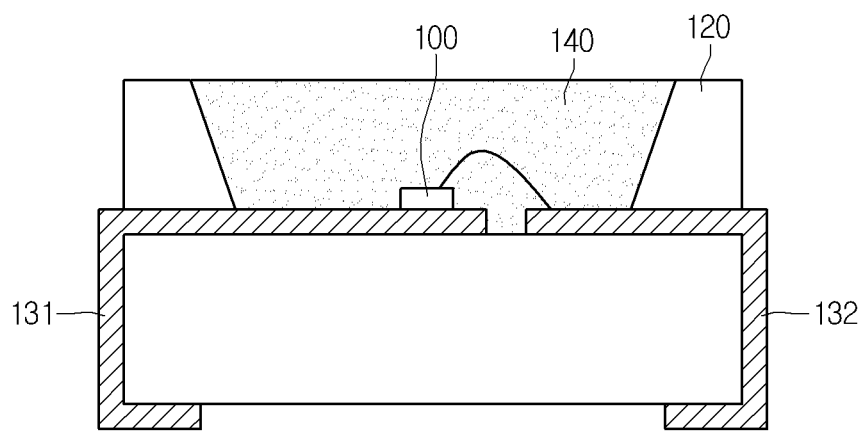
FIG. 22 is a view showing a light emitting device package according to the embodiment.

FIG. 22 is a sectional view showing a light emitting device package to which the light emitting device according to the embodiment is applied.

Referring to FIG. 22, the light emitting device package according to the embodiment comprises a body 120, first and second lead electrodes 131 and 132 formed on the body 120, a light emitting device 100 disposed on the body 120 and electrically connected to the first and second lead electrodes 131 and 132 and a molding member 140 that surrounds the light emitting device 100.

The body 120 may comprise silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may comprise phosphors to change the wavelength of the light emitted from the light emitting device 100.

A plurality of light emitting device or light emitting device packages according to the embodiment may be arrayed on a board, and an optical member comprising a lens, a light guide plate, a prism sheet, or a diffusion sheet may be disposed on the optical path of the light emitted from the light emitting device package. The light emitting device package, the board, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can comprise a light emitting device, or a light emitting device package according to the embodiment. For example, the lighting apparatus may comprise a lamp, a signal lamp, an electric sign board and a headlight of a vehicle.

Figure 24:
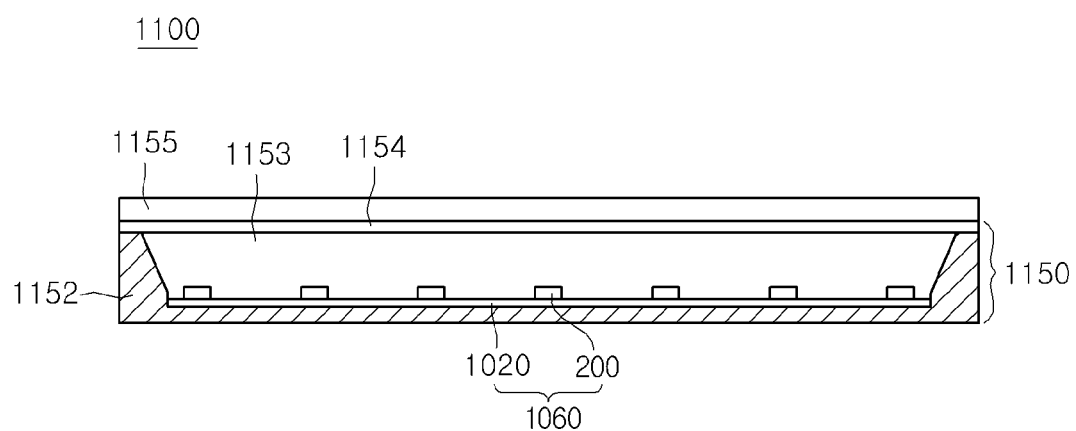
FIG. 24 is a view showing another example of the display device according to the embodiment.
Figure 25:
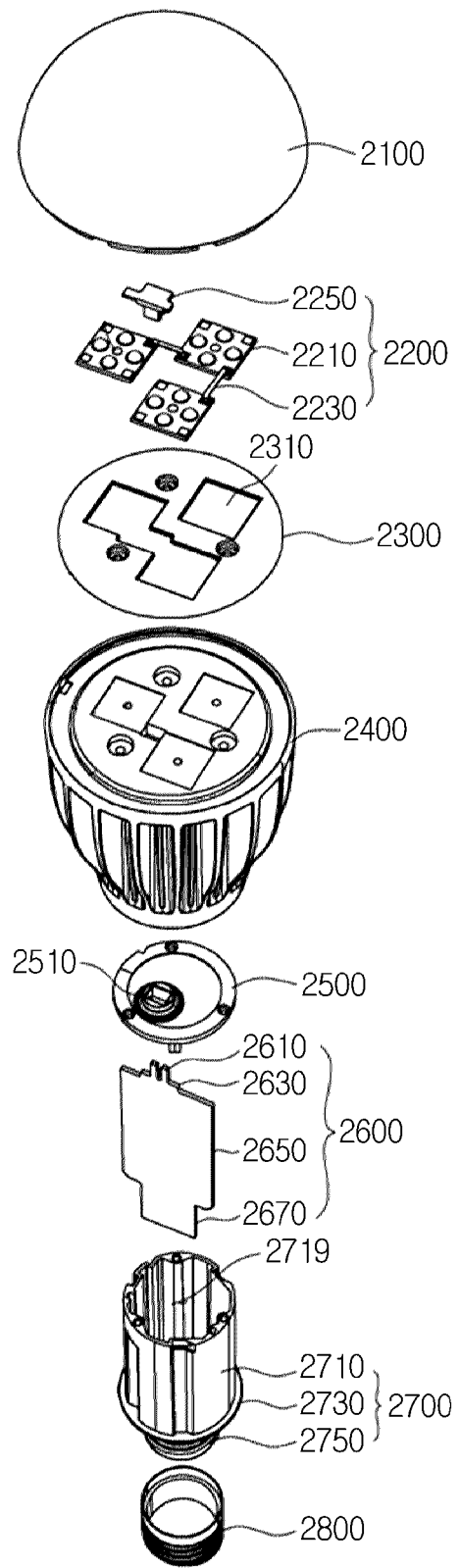
FIG. 25 is a view showing a light unit according to the embodiment.

The light emitting device according to the embodiment may be applied to the light unit. The light unit has a structure in which a plurality of light emitting devices are arrayed. The light unit may comprise a display device as shown in FIGS. 23 and 24 and the lighting apparatus as shown in FIG. 25.

Figure 23:
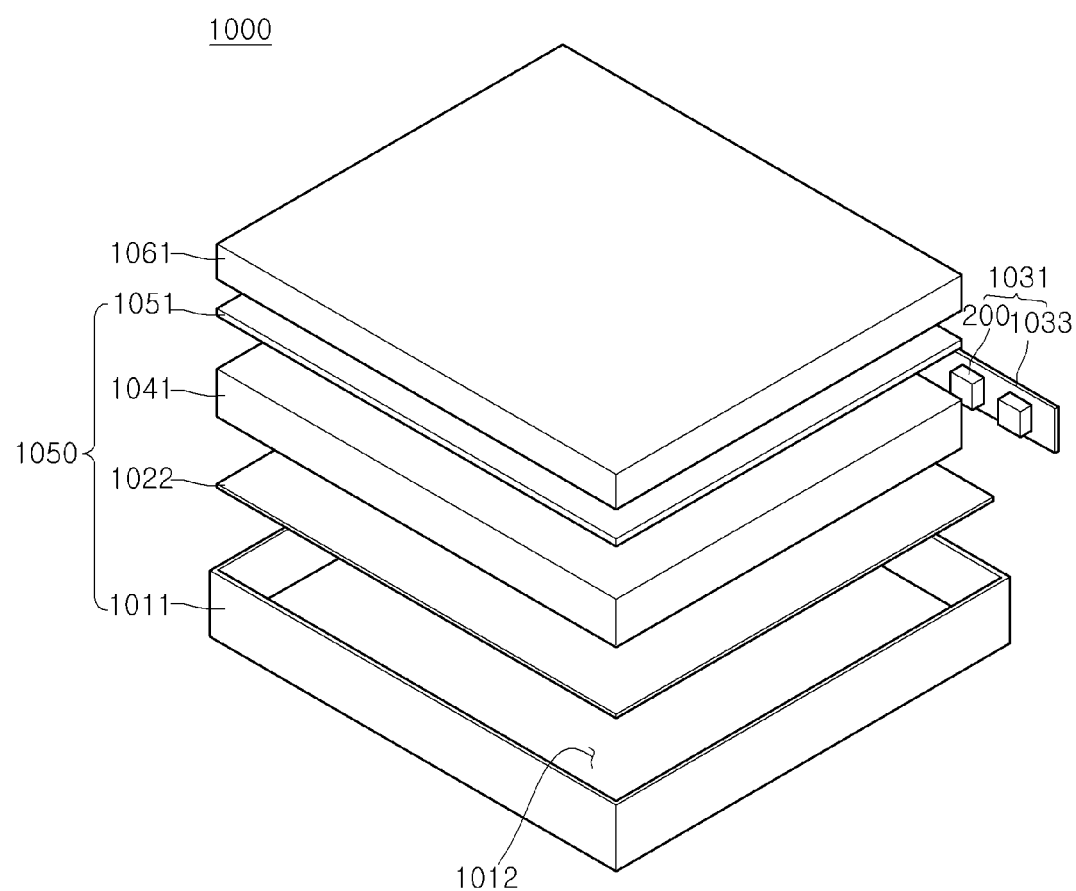
FIG. 23 is a view showing a display device according to the embodiment.

Referring to FIG. 23, a display device 1000 according to the embodiment comprises a light guide plate 1041, a light emitting module 1031 for supplying the light to the light guide plate 1041, a reflective member 1022 disposed below the light guide plate 1041, an optical sheet 1051 disposed above the light guide plate 1041, a display panel 1061 disposed above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may comprise transparent material. For example, the light guide plate 1041 may comprise one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may comprise a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) comprising a circuit pattern. In addition, the board 1033 may also comprise a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for example, is an LCD panel comprising first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and comprises at least one transmissive sheet. For example, the optical sheet 1051 comprises at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be disposed on the display panel 1061, but the embodiment is not limited thereto.

The light guide plate 1041 and the optical sheet 1051 can be disposed on the optical path of the light emitting module 1031 as optical members, but the embodiment is not limited thereto.

FIG. 24 is a sectional view showing another example of a display device according to the embodiment.

Referring to FIG. 24, the display device 1100 comprises a bottom cover 1152, a board 1020 on which the light emitting devices 100 are arrayed, an optical member 1154, and a display panel 1155.

The board 1020 and the light emitting devices 100 may constitute a light emitting module 1060. In addition, the bottom cover 1152, at least one light emitting module 1060, and the optical member 1154 may constitute the light unit.

The bottom cover 1152 can be disposed therein with a receiving section 1153, but the embodiment is not limited thereto.

In this case, the optical member 1154 may comprise at least one of a lens, a light guide plate, a diffusion sheet, horizontal and vertical prism sheets, and a brightness enhanced sheet. The light guide plate may comprise PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 25 is a perspective view showing a lighting apparatus according to the embodiment.

Referring to FIG. 25 the lighting apparatus according to the embodiment may comprise a cover 2100, a light source module 2200, a radiator 2400, a power supply part 2600, an inner case 2700, and a socket 2800. The lighting apparatus according to the embodiment may further comprise at least one of a member 2300 and a holder 2500. The light source module 2200 may comprise the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may comprise a coupling part which is coupled with the radiator 2400.

The cover 2100 may comprise an inner surface coated with a milk-white pigment. The milk-white pigment may comprise a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may comprise glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may comprise a light source 2210, a connection plate 2230, and a connector 2250.

The member 2300 is disposed on a top surface of the radiator 2400, and comprises guide recesses 2310 into which a plurality of light sources 2210 and the connector 2250 are inserted. The guide recesses 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may comprise an insulating material. The connection plate 2230 of the light source module 2200 may comprise an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving recess 2719 of an insulating part 2710 of an inner case 2700. Accordingly, the power supply part 2600 received in the insulating part 2710 of the inner case 2700 is sealed. The holder 2500 comprises a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving recess 2719 of the inner case 2700, and is sealed inside the inner case 2700 by the holder 2500.

The power supply part 2600 may comprise a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may comprise a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+electric wire" and a "−electric wire" are electrically connected to the extension part 2670 and second terminals of the "+electric wire" and the "−electric wire" may be electrically connected to a socket 2800

The inner case 2700 may comprise a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising;
a light emitting structure comprising a first conductive semiconductor layer, an active layer under the first conductive semiconductor layer, and a second conductive semiconductor layer under the active layer;
a first electrode electrically coupled to the first conductive semiconductor layer;
a second electrode electrically coupled to the second conductive semiconductor layer;
a channel layer at a peripheral portion of a lower portion of the light emitting structure;
an insulating layer under the second electrode and the channel layer;
a conductive support member under the insulating layer such that the insulating layer electrically insulates the second electrode from the conductive support member;
a first connection part electrically coupled to the first electrode and the conductive support member; and
a second connection part electrically coupled to the second electrode, wherein one end of the second connection part is spaced apart from a sidewall of the light emitting structure, and exposed to a lateral side of the light emitting structure, wherein a top surface of the channel layer is provided to be higher than a top surface of the active layer, wherein the first connection part is electrically connected to the conductive support member and passes through the insulating layer, wherein a top surface of the second connection part is disposed higher than the top surface of the active layer and lower than a top surface of the first conductive semiconductor layer, and wherein the one end of the second connection part is exposed and protruded upwards from the top surface of the channel layer,
wherein the insulating layer surrounds the channel layer and the second electrode,
wherein the top surface of the channel layer and a top surface of the insulating layer are disposed on the same horizontal plane,
wherein the portion of the insulating layer through which the first connection part passes and the portion of the channel layer through which the second connection part passes horizontally overlap each other.

2. A light emitting device comprising:
a light emitting structure comprising a first conductive semiconductor layer, an active layer under the first conductive semiconductor layer, and a second conductive semiconductor layer under the active layer;
a first electrode electrically coupled to the first conductive semiconductor layer, a portion of the first electrode being arranged on a top surface of the first conductive semiconductor layer;
a second electrode electrically coupled to the second conductive semiconductor layer;
a channel layer at a peripheral portion of a lower portion of the light emitting structure;
a conductive support member under the second electrode;
an insulating layer disposed between the second electrode and the conductive support member such that the insulating layer electrically insulates the second electrode from the conductive support member;
a first connection part electrically coupled to the first electrode and the conductive support member; and
a second connection part electrically coupled to the second electrode and provided on the second electrode, wherein the first connection part makes contact with a lateral side of the first conductive semiconductor layer, and the channel layer surrounds the active layer, wherein a width of the conductive support member is wider than a width of the light emitting structure, and wherein a top surface of the second connection part is higher than a top surface of the active layer and lower than a top surface of the first conductive semiconductor layer,
wherein a side surface of the channel layer surrounds a side surface of the active layer and a side surface of the second conductive semiconductor layer,
wherein a side surface of the insulating layer surrounds and contacts a side surface of the channel layer and a side surface of the second electrode, and
wherein the first connection part is physically and directly connected to the portion of the first electrode that is arranged on the top surface of the first conductive semiconductor layer.

3. The light emitting device of claim 2, wherein the first connection part is electrically connected to the conductive support member passing through a top surface of the insulating Layer.

4. A light emitting device comprising:
a light emitting structure comprising a first conductive semiconductor layer, an active layer under the first conductive semiconductor layer, and a second conductive semiconductor layer adjacent the active layer;

a first electrode electrically coupled to the first conductive semiconductor layer, a portion of the first electrode being provided on a top surface of the first conductive semiconductor layer;

a second electrode electrically coupled to the second conductive semiconductor layer;

a channel layer at a peripheral portion of a lower portion of the light emitting structure;

a conductive support member adjacent to the second electrode;

an insulating layer provided between the second electrode and the conductive support member such that the insulating layer electrically insulates the second electrode from the conductive support member;

a first connection part electrically coupled to the first electrode and the conductive support member; and a second connection part electrically coupled to the second electrode and provided on the second electrode, wherein a top surface of the channel layer is disposed higher than a top surface of the active layer, wherein a portion of the channel layer is disposed between a bottom surface of the second conductive semiconductor layer and a top surface of the second electrode, wherein the second connection part contacts to the second electrode and passes through a portion of the channel layer, the portion of the channel layer being provided on an uppermost top surface of the second electrode, wherein the top surface of the channel layer is disposed lower than a top surface of the first conductive semiconductor layer, and wherein the first connection part passes through a portion of the insulating layer, the portion of the insulating layer horizontally overlapped with the active layer, wherein the channel layer surrounds the active layer and the second conductive semiconductor layer, and wherein the insulating layer surrounds the channel layer and the second electrode.

5. The light emitting device of claim 4, wherein one end of the second connection part is disposed on the channel layer.

6. The light emitting device of claim 4, wherein one end of the second connection part is spaced apart from a sidewall of the light emitting structure and exposed to a lateral side of the light emitting structure.

7. The light emitting device of claim 4, wherein the second electrode comprises a metal layer under the second conductive semiconductor layer, and wherein the second connection part is electrically coupled to the metal layer.

8. The light emitting device of claim 4, wherein a top surface of the insulating layer is exposed to the peripheral portion of the lower portion of the light emitting structure.

9. The light emitting device of claim 4, wherein the first connection part contacts a lateral side of the first conductive semiconductor layer.

10. The light emitting device of claim 4, further comprising an ohmic contact layer provided between the second electrode and the second conductive semiconductor layer.

11. The light emitting device of claim 4, wherein a side surface of the channel layer surrounds and contacts a side surface of the active layer.

12. The light emitting device of claim 4, wherein a side surface of the channel layer surrounds and contacts a side surface of the second conductive semiconductor layer.

13. The light emitting device of claim 4, wherein the first electrode is provided over the first conductive semiconductor layer.

14. The light emitting device of claim 4, wherein one lateral side of the light emitting structure is aligned at a distance of about 20 μm or less from one lateral side of the conductive support member.

15. The light emitting device of claim 4, wherein a width of the conductive support member is wider than a width of the light emitting structure.

16. The light emitting device of claim 4, wherein one end of the second connection part is exposed and protruded upwards from the top surface of the channel layer.

17. The light emitting device of claim 4, wherein the top surface of the channel layer and a top surface of the insulating layer are disposed on the same horizontal plane.

* * * * *